(12) United States Patent
Hall et al.

(10) Patent No.: US 10,734,939 B2
(45) Date of Patent: *Aug. 4, 2020

(54) SOLAR SHINGLE ROOFING ASSEMBLY

(71) Applicant: Hall Labs LLC, Provo, UT (US)

(72) Inventors: David R. Hall, Provo, UT (US); Seth Myer, Eagle Mountain, UT (US)

(73) Assignee: Hall Labs LLC, Provo, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/299,396

(22) Filed: Mar. 12, 2019

(65) Prior Publication Data
US 2019/0214938 A1    Jul. 11, 2019

Related U.S. Application Data

(63) Continuation-in-part of application No. 16/226,649, filed on Dec. 20, 2018, and a continuation-in-part of
(Continued)

(51) Int. Cl.
*H02S 20/25*    (2014.01)
*H01L 31/0475*    (2014.01)
(Continued)

(52) U.S. Cl.
CPC .......... *H02S 20/25* (2014.12); *H01L 31/0475* (2014.12); *H02S 40/36* (2014.12); *H02S 40/42* (2014.12); *Y02B 10/12* (2013.01)

(58) Field of Classification Search
CPC .......... H02S 40/36; H02S 20/25; H02S 40/42; H01L 31/0475
(Continued)

(56) References Cited

U.S. PATENT DOCUMENTS

| 2,989,575 A | * | 6/1961 | Wallace, Jr. | .......... H01L 31/042 |
| | | | | 136/246 |
| 3,524,921 A | * | 8/1970 | Wolf | .................... H01B 7/0838 |
| | | | | 174/70 C |

(Continued)

FOREIGN PATENT DOCUMENTS

| DE | 102008012248 A1 | * | 9/2009 | ............. H02S 20/25 |
| GB | 2533422 A | * | 6/2016 | ......... E04D 13/0445 |
| JP | 2004308409 A | * | 11/2004 | ............. H02S 20/23 |

*Primary Examiner* — Patrick J Maestri
*Assistant Examiner* — Joseph J. Sadlon

(57) ABSTRACT

In one aspect, the invention is a solar shingle roofing assembly that includes a roofing underlayment providing mechanical and electrical connection for solar shingles. The system also includes an array of rectangular solar shingles, each solar shingle with a first side edge, a second side edge, a bottom edge and a top edge. Each solar shingle is shaped to form at least one channel on an upper surface running from the top edge to the bottom edge and shaped to form at least two air gaps between the bottom surface of the shingle and the top surface of the underlayment and running parallel to the at least one channel. In the array of shingles, the air gaps of vertically adjacent shingles are aligned to thereby form continuous air gaps running from a bottom of the array to a top of the array. The solar shingles are mechanically and electrically connected to the roofing underlayment. In a preferred embodiment, each solar shingle further comprises a first layer of phase change material on a bottom surface of each solar shingle.

19 Claims, 38 Drawing Sheets

Related U.S. Application Data application No. 16/226,646, filed on Dec. 20, 2018, and a continuation-in-part of application No. 15/391,347, filed on Dec. 27, 2016, now abandoned.

(51) Int. Cl.
*H02S 40/36* (2014.01)
*H02S 40/42* (2014.01)

(58) Field of Classification Search
USPC .......................................... 52/173.3; 136/244
See application file for complete search history.

(56) References Cited

U.S. PATENT DOCUMENTS

| | | | | |
|---|---|---|---|---|
| 4,202,319 A * | 5/1980 | Vinz | ................ | E04B 7/225 |
| | | | | 126/634 |
| 5,614,033 A * | 3/1997 | Robinson | ................ | B64G 1/50 |
| | | | | 136/245 |
| 5,990,414 A * | 11/1999 | Posnansky | ............ | H01L 31/048 |
| | | | | 136/244 |
| 6,111,189 A * | 8/2000 | Garvison | .......... | H01L 31/02008 |
| | | | | 136/244 |
| 6,360,497 B1 * | 3/2002 | Nakazima | ................ | E04D 1/24 |
| | | | | 126/622 |
| 6,662,509 B2 * | 12/2003 | Sharp | .................... | E04D 13/174 |
| | | | | 454/250 |
| 7,678,991 B2 * | 3/2010 | McCaskill | ................ | E04D 1/26 |
| | | | | 136/244 |
| 7,858,874 B2 * | 12/2010 | Ruskin | .................... | E04D 1/26 |
| | | | | 136/244 |
| 8,003,882 B2 * | 8/2011 | Pisklak | .................... | E04D 1/26 |
| | | | | 136/244 |
| 8,707,643 B1 * | 4/2014 | Kalkanoglu | .............. | E04D 1/24 |
| | | | | 52/173.3 |
| 9,228,356 B2 * | 1/2016 | Edwards | .................. | E04D 1/24 |
| 9,273,885 B2 * | 3/2016 | Rodrigues | .............. | H02S 40/32 |
| 9,518,391 B2 * | 12/2016 | Haynes | .................. | E04D 13/00 |
| 10,574,178 B2 | 2/2020 | Lopez | .................... | E04D 1/12 |
| 2011/0000535 A1 * | 1/2011 | Davidson | ................. | E04D 3/32 |
| | | | | 136/256 |
| 2012/0042588 A1 * | 2/2012 | Erickson, Jr. | ...... | H01L 31/02021 |
| | | | | 52/173.3 |
| 2013/0212959 A1 * | 8/2013 | Lopez | .................... | H02S 40/36 |
| | | | | 52/173.3 |
| 2014/0115980 A1 * | 5/2014 | Edwards | ............... | E04D 13/152 |
| | | | | 52/173.3 |
| 2014/0366470 A1 * | 12/2014 | Edwards | ................... | E04D 1/24 |
| | | | | 52/232 |
| 2017/0237390 A1 * | 8/2017 | Hudson | .................. | E04D 3/366 |
| | | | | 136/251 |

* cited by examiner

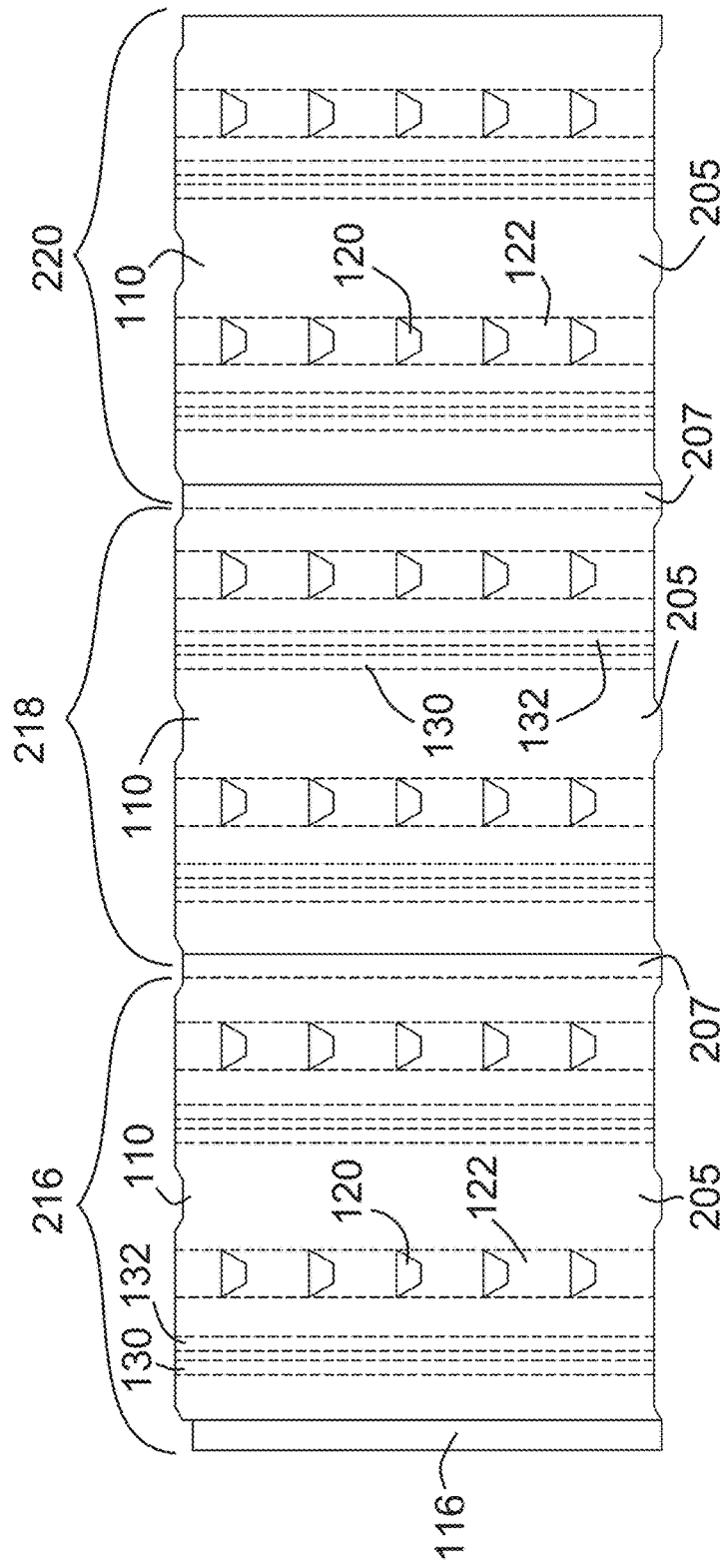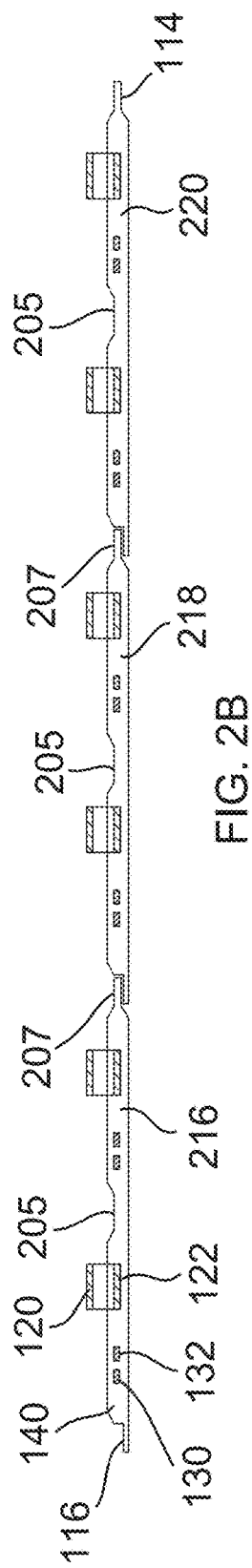

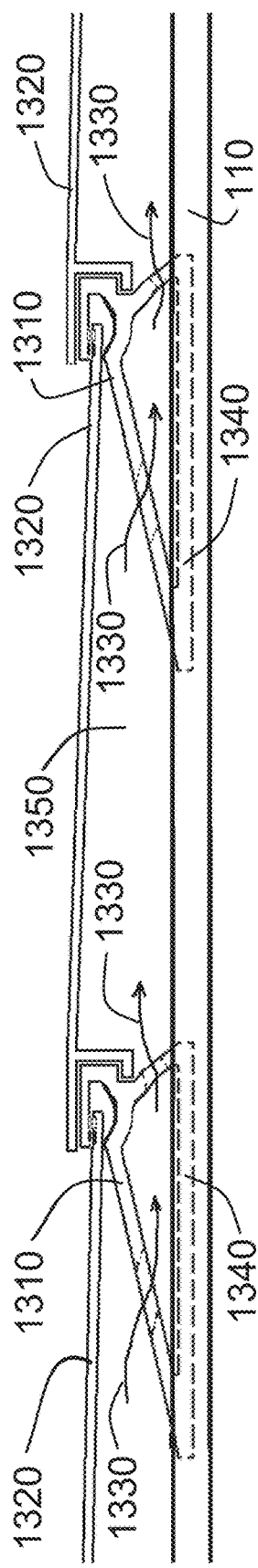
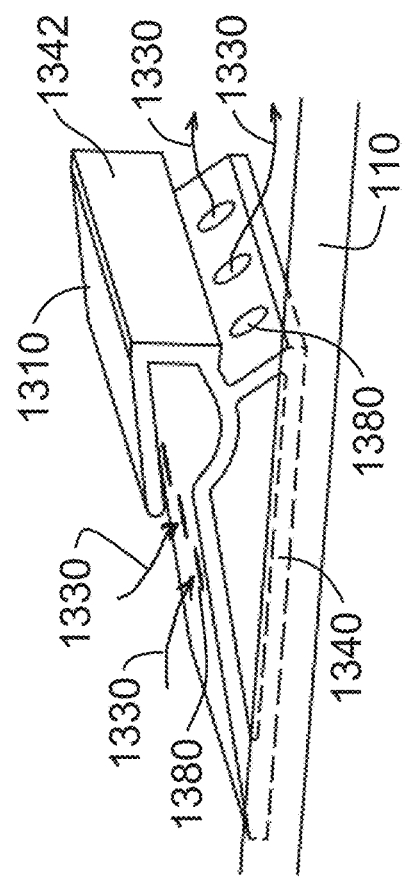
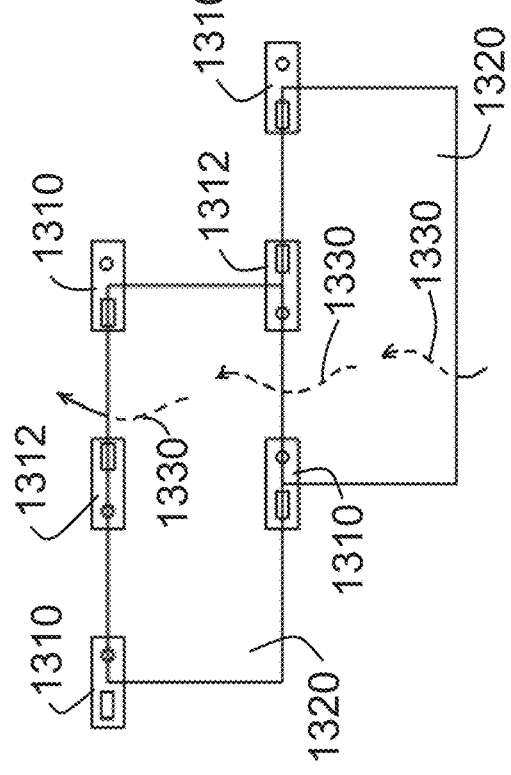
FIG. 13A
FIG. 13B
FIG. 13C

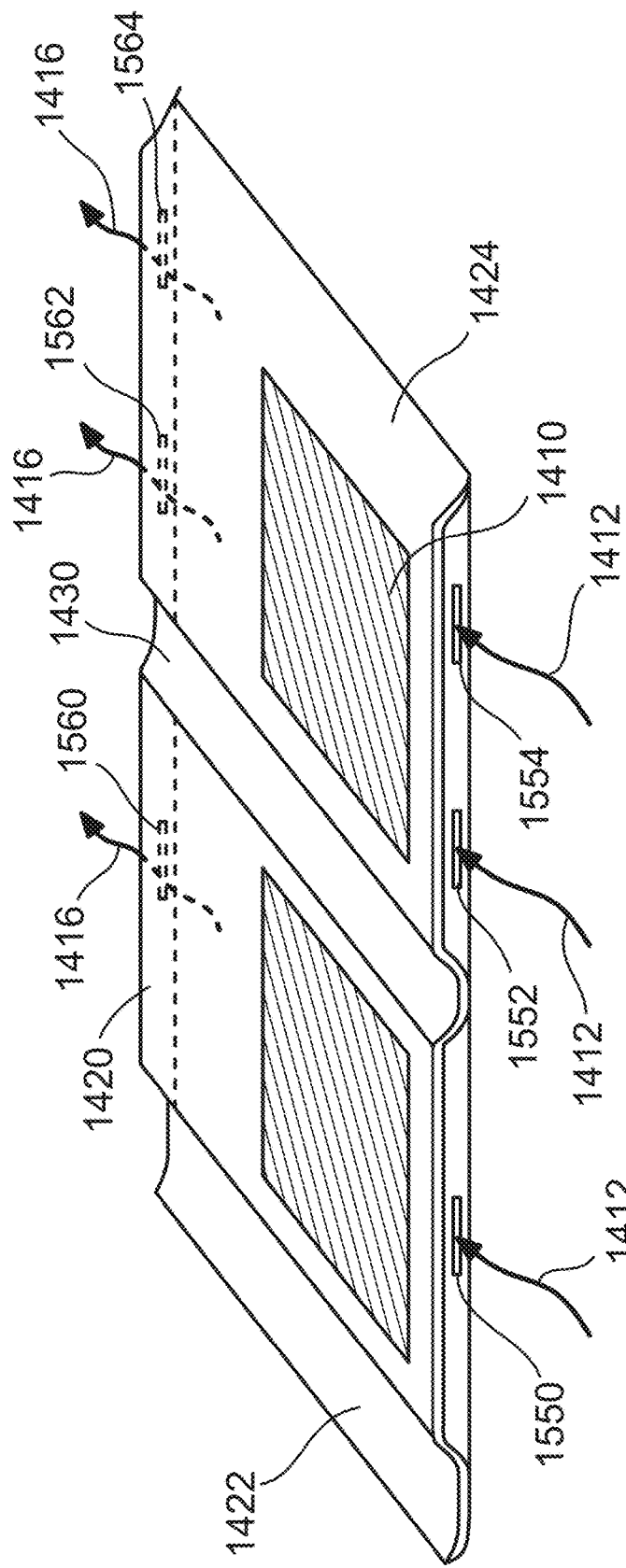
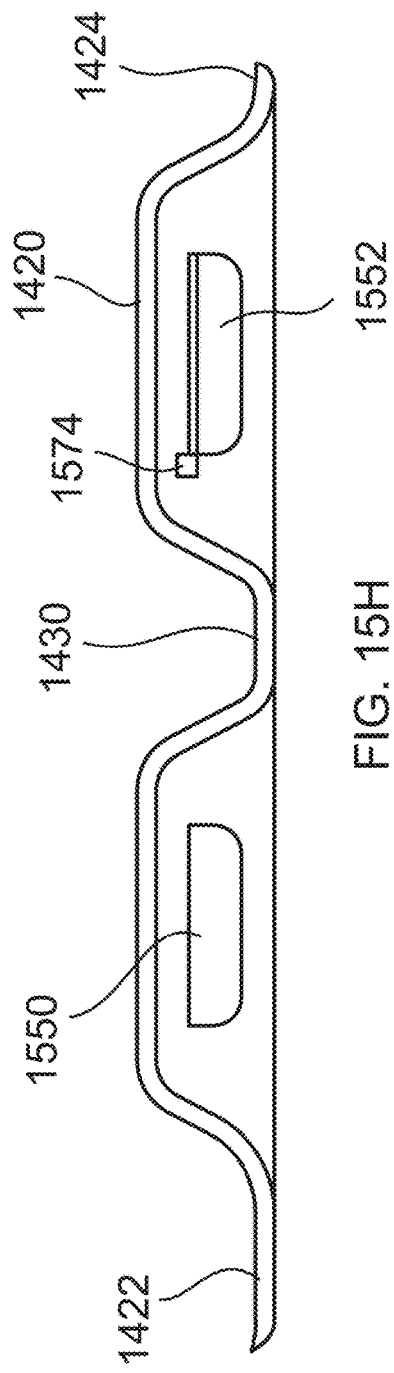
FIG. 15G
FIG. 15H

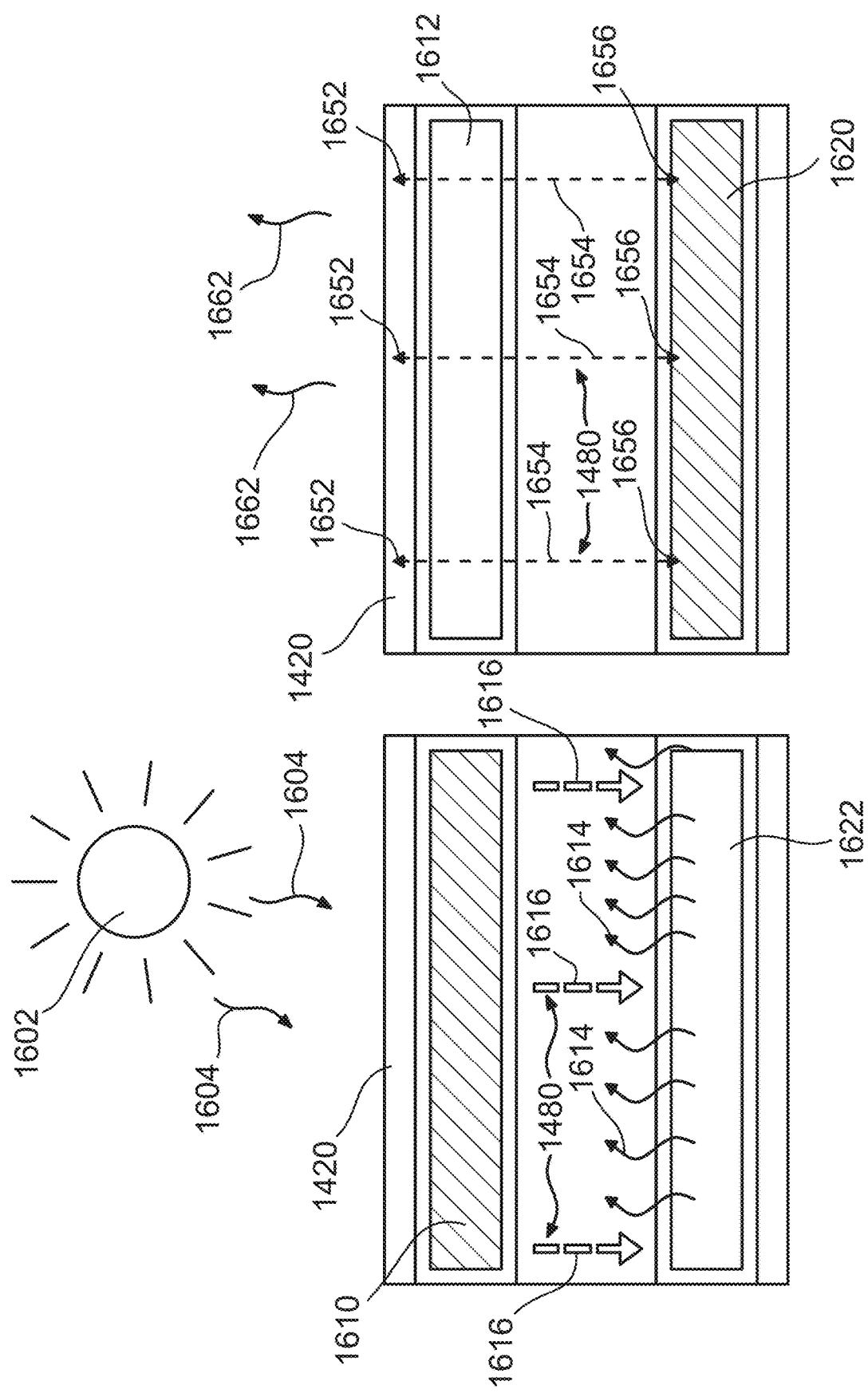

SOLAR SHINGLE ROOFING ASSEMBLY

CROSS-REFERENCE TO RELATED APPLICATIONS

This application is a continuation in part of U.S. Published Patent Application No. 2018-0183382, filed Dec. 27, 2016 and entitled "Interlocking Roofing System." This application is also a continuation-in-part of U.S. patent application Ser. No. 16/226,646, filed Dec. 20, 2018 and entitled "Electrical and Mechanical Roof Underlayment for Solar Shingles". This application is also a continuation-in-part of U.S. patent application Ser. No. 16/226,649, filed Dec. 20, 2018 and entitled "Electrical and Mechanical Roof Underlayment for Solar Shingles with Air Gap". The entire disclosures of these prior applications are hereby incorporated herein by reference.

TECHNICAL FIELD

This invention relates to solar shingle roofing assemblies.

BACKGROUND

Solar shingles have been available for more than a decade. The installation of most of the solar shingle systems on the market today are very labor intensive. With most systems, it is necessary to first prepare the roof for the installation of the shingles. This may include placing a protective layer or water-resistant material on the roof surface. Structural features may also be installed on the roof in order to mechanically connect the shingles to the roof. These structural features may include some kind of rack or channel that the shingles attach to. These racks or channels must be physically attached to the roof structure. Typically, this requires a penetration through the water-resistant material and roof sheathing with screws or some other attachment mechanism. Every penetration may create a potential for future leaks in the roof.

For traditional solar shingle systems, once the structure is in place to support the shingles, the electrical wiring must be provided to each of the shingles. Typically, each shingle is "daisy-chained" together with adjacent shingles in the same row, connecting a row of shingles in series. At the end of each row there is normally a junction box that combines multiple rows of shingles and runs the combined power of these multiple rows of shingles to an electrical distribution system via an electrical power panel in the house or building.

The connection of shingles to adjacent shingles is normally done by connecting a shingle with an MC4 connector that provides a watertight electrical connection between two adjacent shingles. The row wiring at the end of each row of shingles typically has a junction box that combines multiple row wiring runs together, then has a combined home run back to the service panel. These steps typically require a significant amount of labor.

Many solar roof shingle systems typically consist of a series of solar shingles connected together either in series or in parallel. They are normally connected by wires with male and female connectors on either side of the wiring that connects the shingles. The wiring is either run along the backside of the shingles along a mounting rack, or along the inside of the back frame of the shingle itself. In some cases, the wiring is run inside a wiring chase or raceway behind the shingles.

In some cases, the shingles are applied directly to the roof surface. In other cases, a support structure is attached to the roof that provides a raceway for interconnecting wiring between the shingles. In every case it is necessary to electrically connect each solar shingle to an electrical circuit that distributes the electricity produced by the solar shingles to an electrical circuit.

Alternatively, the connecting wiring for multiple shingles may be integrated within the shingle itself, as described in patent application Ser. No. 15/261,160 submitted 9 Sep. 2016, entitled "Photovoltaic Modular System". When the wiring is integrated or embedded within each of the shingles in the system, there still is the need to connect the wiring from the shingles to the electrical panel or devices being served by the shingles. It is also necessary to structurally attach the shingles to the roof.

Solar power systems are typically mounted in a location facing the sun in order to maximize the exposure to solar energy. However, there can be obstructions to the direct sunlight needed to power the solar panels. Clouds, trees, and architectural features or building elements can cause shading. Even partial shading of the solar panel can dramatically reduce the power output since the electron flow inside the panel is in series. Shading of only one section or portion of the solar panel will block the flow for the entire panel or group of panels.

Traditional solar power systems normally include multiple solar panels that are connected to each other by either parallel or series wiring (or a combination of both).

For many solar shingles, a junction box or other similar equipment, connectors or parts are required for the connection to the power circuits that extend back to an electrical service panel. The connection to the interconnecting wiring with wire nuts or connectors and installing junction boxes requires a lot of time and labor.

In addition to the electrical connections, there is also needed a system to attach the shingles to a structure such as a roof structure. In some systems, the shingles are attached to the roof with adhesive or otherwise physically attached by nails or screws.

It is known that many solar shingles that are attached directly to the roof surface are not as efficient because of heat buildup. Many of the traditional systems do not provide a pathway for air to be transmitted behind the shingles and out of the top ridgeline of the roof to allow for naturally cooling of the shingles.

SUMMARY

In one aspect, the invention is a solar shingle roofing assembly that includes a roofing underlayment providing mechanical and electrical connection for solar shingles. The system also includes an array of rectangular solar shingles, each solar shingle with a first side edge, a second side edge, a bottom edge and a top edge. Each solar shingle is shaped to form at least one channel on an upper surface running from the top edge to the bottom edge and shaped to form at least two air gaps between the bottom surface of the shingle and the top surface of the underlayment and running parallel to the at least one channel. In the array of shingles, the air gaps of vertically adjacent shingles are aligned to thereby form continuous air gaps running from a bottom of the array to a top of the array. The solar shingles are mechanically and electrically connected to the roofing underlayment.

In a preferred embodiment, each solar shingle further comprises a first layer of phase change material on a bottom surface of each solar shingle.

In a preferred embodiment, the solar shingle roofing assembly may be mounted to a roof. The invention comprises an array of solar shingles with air gap channels running vertically up from a lower part of the array up to the top of the roof assembly, allowing the natural convection of heat to draw cool air in from the lower part of the array up to a vent at the top of the roof, improving energy production. The air flow may be controlled by louvers or doors that control the size of openings into the air gap area or exiting it. The invention may further comprise a control system that monitors and controls the louvers or doors. The air gap area may further comprise one or more phase change material layers that enhance the thermal performance of the system. The invention comprises support brackets which attach the shingles to the roof, along with a roofing underlayment with the support brackets embedded therein. The system provides electrical and mechanical connection of the shingles to a roof. Contacts are integral and embedded into each individual shingle.

This invention has been developed in response to the present state of the art and, in particular, in response to the problems and needs in the art that have not yet been fully solved by currently available systems and methods. Features and advantages of different embodiments of the invention will become more fully apparent from the following description and appended claims or may be learned by practice of the invention as set forth hereinafter.

Consistent with the foregoing, a solar shingle roofing assembly is disclosed. The objectives of the system are to provide a solar shingle roofing assembly mounted to a roof. The invention comprises an array of solar shingles with air gap channels running vertically up from a lower part of the array up to the top of the roof assembly, allowing the natural convection of heat to draw cool air in from the lower part of the array up to a vent at the top of the roof, improving energy production. The air flow may be controlled by louvers or doors that control the size of openings into the air gap area or exiting it. The invention may further comprise a control system that monitors and controls the louvers or doors. The air gap area may further comprise one or more phase change material layers that enhance the thermal performance of the system. The invention comprises support brackets which attach the shingles to the roof, along with a roofing underlayment with the support brackets embedded therein. The system provides electrical and mechanical connection of the shingles to a roof. Contacts are integral and embedded into each individual shingle.

In certain embodiments, a solar shingle roofing assembly may include a roofing underlayment providing mechanical and electrical connection for solar shingles. The solar shingles may include an array of rectangular solar shingles, each solar shingle with a first side edge, a second side edge, a bottom edge and a top edge. Each solar shingle may be shaped to form at least one channel on an upper surface running from the top edge to the bottom edge and shaped to form at least two air gaps between the bottom surface of the shingle and the top surface of the underlayment and running parallel to the at least one channel. In the array of shingles, the air gaps of vertically adjacent shingles may be aligned to thereby form continuous air gaps running from a bottom of the array to a top of the array. The solar shingles may mechanically and electrically connect to the roofing underlayment. Each solar shingle may also include a first layer of phase change material on a bottom surface of each solar shingle.

In other embodiments, the roofing underlayment providing mechanical and electrical connection for solar shingles may also include a water-impervious membrane adapted to be attached to a roof. The underlayment may also include a mechanical attachment member having a mechanical first portion embedded within the membrane and having a mechanical second portion extending above the membrane. The mechanical second portion of the mechanical attachment member may be configured to mechanically attach a solar shingle to the roof. An electrical conductor may also be included in the underlayment having an electrical first portion of which is embedded within the membrane, having an electrical second portion which is configured to electrically connect to a solar shingle, and having an electrical third portion which is configured to electrically connect to an electrical circuit.

In an embodiment, each solar shingle may also include a second layer of phase change material below the first layer of phase change material. The first layer of phase change material may be configured to change phase during wintertime temperatures of 5 degrees Celsius and lower. The second layer of phase change material is configured to change phase during summertime temperatures of 20 degrees Celsius and above.

In one embodiment, a roof facing side of the membrane may also include an adhesive covered by a protective backing material. The adhesive may be a pressure-sensitive adhesive protected by a peelable layer prior to attachment to the roof.

In an embodiment, the solar shingles may include a photovoltaic current producing module section embedded within a portion of the solar shingle. In another embodiment, a congruent shingle of the solar shingles may include a shingle of standard roofing material composition that is congruent visually with the solar shingle having similar or matching color and texture. The solar shingles may also include a plurality of contacts wherein the contacts electrically connect the solar shingle to an adjacent solar shingle or combined shingle.

In other embodiments, the solar shingles may also include a plurality of contacts wherein the contacts electrically connect the photovoltaic current producing module to electrical contacts in the membrane. The solar shingles may also include electrical wiring connecting the photovoltaic current producing module to the contacts. The photovoltaic current producing module may also include control circuiting which controls an electrical current flowing between one or more solar shingles.

In certain embodiments, an overlap area including a waterproof sealant preventing air flow and water penetration between overlapping shingles may seal all overlap areas between all overlapping sections of the overlapping shingles. The overlap area may also include mechanical interlocking features mechanically locking adjacent shingles together when installed. The interlocking features may include sliding channels that lock together the adjacent shingles and allowing the lock to be released when slid apart.

In an embodiment, one or more electrical conductors are not embedded in the membrane and is routed within the air gap or otherwise under the solar shingles.

In other embodiments, the multiple portions extending above the membrane may be mechanically configured for receiving attachment members on multiple solar shingles. The attachment members on the multiple solar shingles also include electrical connection features. Each solar shingle may also include an air flow control mechanism that controls the flow of air within the air gap. The air flow control mechanism may include a passive heat activated mechanism that increases the size of least one opening into the air gap when temperatures increase within the air gap.

In certain embodiments, the roofing underlayment may also include control circuiting. The air flow control mechanism may be activated by a signal received from the control circuiting.

In other embodiments, the mechanical attachment member and the multiple electrical portions of the electrical conductor may be in proximity and configured so that mechanical attachment and electrical connection of the solar shingle happen simultaneously. The membrane may be adapted to be attached to a roof by adhesive. The membrane may further include a raised area for connecting the multiple electrical extending portions to the multiple solar shingles.

In a preferred embodiment, a photovoltaic modular solar shingle system may include a system for installing solar shingles on a slanted roof. The system may include a roofing underlayment on top of the roof and providing mechanical and electrical connection for solar shingles. The system may further include a plurality of rectangular solar shingles, each shingle with a top edge and a bottom edge, a plurality of shingle support brackets rising from the underlayment, at least some of the brackets having a first channel opening generally downward and at least some others of the brackets have a second channel opening generally upward. The top edge of each shingle may be received into the first channel of at least one bracket and the bottom edge of each shingle may be received into the second channel of at least one other bracket. The depth of the first channel may be great enough to allow the top edge of a shingle to be inserted far enough for the bottom edge to align with a second channel, and to allow the bottom edge of the shingle to fall into the second channel while the top edge is still retained by the first channel.

In an embodiment, most of the brackets may include both a first channel and a second channel, whereby the bracket supports the top edge of one shingle in the first channel and the bottom edge of an other shingle in the first channel. The brackets may be arranged so that the top edge of each shingle is supported by at least two brackets and the bottom edge of each shingle is supported by at least two other brackets. At least some of the brackets may include an electrical connection within the first channel, whereby the solar shingle is electrically connected an electrical grid. The electrical grid may further be embedded within the underlayment.

In another embodiment, the electrical connection between the shingle and the first channel may be configured to electrically connect when the top edge of a solar shingle is inserted into the first channel and configured to maintain the connection when the bottom edge falls into the second channel. In one embodiment, the electrical connections may include at least one of standard MC4 solar connectors; standard electrical connectors; connectors with screw on retaining rings; connectors with mechanical releasing clasps; and connectors with friction retaining members.

In certain embodiments, the electrical conductor second portion may be configured to slide thru a channel within at least one of the mechanical attachments, the connecting attachment; and the receiving attachment, allowing the solar shingle to be released from the attachments, providing access to the releasing mechanisms of the electrical connectors.

In another embodiment, the brackets may be configured to hold a bottom surface of each solar shingle above the underlayment, thereby creating an air gap between the shingles and the underlayment. An electrical grid for connecting the shingles may be disposed within the air gap. The solar shingles may be shaped in such a way to create an air gap between the solar shingles and the underlayment.

In an embodiment, a solar shingle interconnection system may include a roofing underlayment providing mechanical and electrical connection for solar shingles; each solar shingle with opposed side edges comprising a protruding edge and a receiving edge. Each solar shingle may further include a receiving attachment along a top edge of the shingle configured to mechanically connect to a first mating portion of a mechanical attachment of the underlayment. Each solar shingle may further include a connecting attachment along a bottom edge of the shingle configured to mechanically connect to a second mating portion of the mechanical attachment. The first mating portion of the mechanical attachment may further mechanically secure the receiving attachment of the first solar shingle when a first motion of sliding the receiving attachment forward and fully engaging with the first mating portion of the mechanical attachment is completed; and the second mating portion of the mechanical attachment may then mechanically secure the connecting attachment of the first solar shingle when a second motion of sliding the connecting attachment backwards and fully engaging with the second mating portion of mechanical attachment is completed. At least one of the solar shingles may electrically and mechanically connects to the roofing underlayment.

In certain embodiments, the roofing underlayment may provide mechanical and electrical connection for solar shingles further including a water-impervious membrane adapted to be attached to a roof. A mechanical attachment member may have a mechanical first portion embedded within the membrane and a mechanical second portion extending above the membrane. The mechanical second portion of the mechanical attachment member may be configured to mechanically attach a solar shingle to the roof. An electrical conductor may have an electrical first portion that is embedded within the membrane. The electrical conductor may further have an electrical second portion which is configured to electrically connect to a solar shingle and may have an electrical third portion which is configured to electrically connect to an electrical circuit. The shingle support brackets may be attached to the mechanical attachment member.

In an embodiment, the solar shingles may mechanically and electrically connect to an adjacent solar shingle.

In one embodiment, the electrical connections may include contacts which are embedded within at least one of the mechanical connections; the electrical connections; the shingle support brackets; the first channel; and the second channel.

In other embodiments, the solar shingles may also include a plurality of contacts wherein the contacts electrically connect the solar shingle to an adjacent solar shingle. The solar shingles may also include a plurality of contacts wherein the contacts electrically connect the solar shingle to electrical contacts in the membrane. The solar shingles may also include a plurality of contacts wherein the contacts electrically connect the solar shingle to control circuiting. The control circuiting may control an electrical current flowing between one or more solar shingles.

Further aspects and embodiments are provided in the foregoing drawings, detailed description and claims.

BRIEF DESCRIPTION OF THE DRAWINGS

The following drawings are provided to illustrate certain embodiments described herein. The drawings are merely illustrative and are not intended to limit the scope of claimed inventions and are not intended to show every potential feature or embodiment of the claimed inventions. The drawings are not necessarily drawn to scale; in some instances, certain elements of the drawing may be enlarged with respect to other elements of the drawing for purposes of illustration.

FIG. 2A is a top view of three membranes connected together.

FIG. 2B is a section view of three membranes connected together.

FIG. 13A is a side view section of multiple solar shingles attached to the membrane with an air gap between the shingles and the membrane.

FIG. 13B is an overhead view of two shingles with connectors.

FIG. 13C is a perspective drawing of a mechanical/electrical connector.

FIG. 15G is an isometric view of a solar shingle with air flow passing through.

FIG. 15H is an end view of a solar shingle with air flow openings.

FIG. 16A is a section view of a solar shingle with two phase change layers and air gap.

FIG. 16B is a section view of another embodiment of a solar shingle with two phase change layers and air gap.

DETAILED DESCRIPTION

Figure 1A:
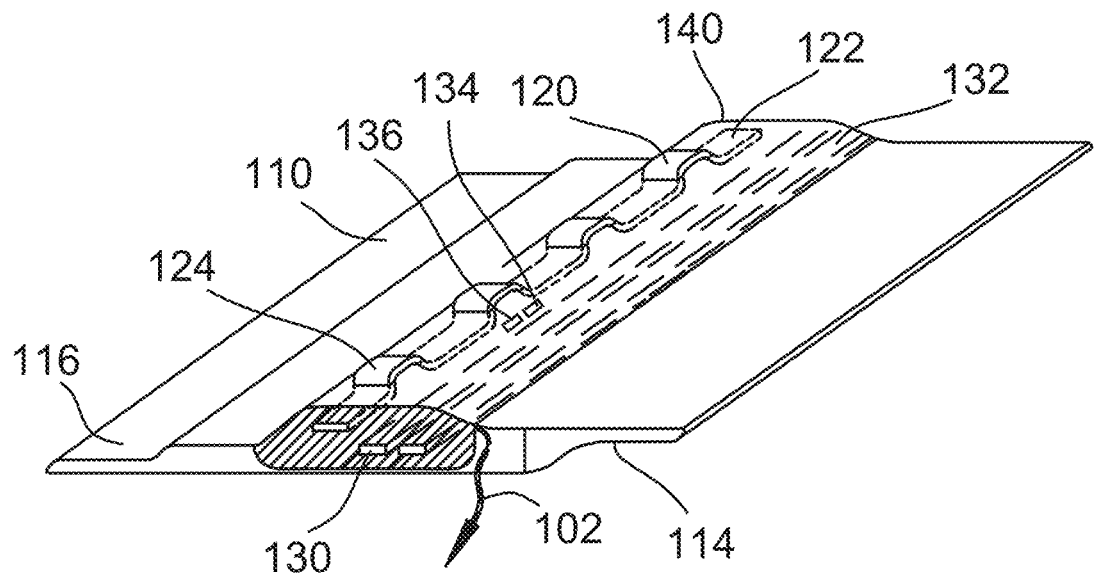
FIG. 1A is an isometric view of the underlayment.

The following description recites various aspects and embodiments of the inventions disclosed herein. No particular embodiment is intended to define the scope of the invention. Rather, the embodiments provide non-limiting examples of various compositions, and methods that are included within the scope of the claimed inventions. The description is to be read from the perspective of one of ordinary skill in the art. Therefore, information that is well known to the ordinarily skilled artisan is not necessarily included.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Definitions

The following terms and phrases have the meanings indicated below, unless otherwise provided herein. This disclosure may employ other terms and phrases not expressly defined herein. Such other terms and phrases shall have the meanings that they would possess within the context of this disclosure to those of ordinary skill in the art. In some instances, a term or phrase may be defined in the singular or plural. In such instances, it is understood that any term in the singular may include its plural counterpart and vice versa, unless expressly indicated to the contrary.

As used herein, the singular forms "a," "an," and "the" include plural referents unless the context clearly dictates otherwise. For example, reference to "a substituent" encompasses a single substituent as well as two or more substituents, and the like.

As used herein, "for example," "for instance," "such as," or "including" are meant to introduce examples that further clarify more general subject matter. Unless otherwise expressly indicated, such examples are provided only as an aid for understanding embodiments illustrated in the present disclosure and are not meant to be limiting in any fashion. Nor do these phrases indicate any kind of preference for the disclosed embodiment.

"Solar shingles" and "shingles" as referred to throughout this document may refer to an electrical module that produces energy, collects energy, produces power, transmits power, conducts electricity, communicates energy, converts energy from one form to another, and combinations of one or more of the foregoing. "Solar Shingles" in a preferred embodiment, also refer to Photovoltaic (PV) electrical modules that collect solar energy from the sun and convert it to electrical energy. In a preferred embodiment, the solar shingles also provide protection from the environment (wind, rain and other wind-blown materials or other elements), in that they act as actual roof shingles.

In summary, the key advantages posited for the Photovoltaic Modular Solar Shingles include a system that:

provides a simple "plug-in" installation of solar shingles to a roof, provides mating connectors on the solar shingles that mate to connectors in a roof membrane, includes mechanical and electrical connections for the solar shingles within the mating connectors attached to a roof membrane, incorporates interconnecting wiring into the roof membrane or underlayment, provides an electrically insulated and environmentally protected pathway from the solar shingles to the electrical devices being served or to an electrical service panel;

provides a protected connection between the shingles and the electrical conductors and wiring connecting the shingles to electrical loads or panel;

provides a mechanical connection of the shingles to the membrane;

provides a structural attachment of the membrane to the roof structure;

allows multiple shingles or rows of interconnected shingles to be connected to an electrical interconnection system;

Provides an air gap area between the shingles and the membrane for air flow;

simplifies installation by providing a peel and stick adhesive system that allows the attachment of the membrane to a roof or other building structure; and further simplifies the installation by making the electrical connection of the shingles to the electrical interconnection system by a simple plug-in connection.

Referring to the drawings, FIG. 1A is an isometric view of the underlayment. The membrane 110 shown in the illustration has a top surface 116 that interfaces with a bottom surface of an adjacent membrane (not shown). The bottom surface 114 of the membrane 110 interfaces with another adjacent membrane (not shown). Thus, multiple membranes may be connected together. In some embodiments multiple membranes are adhesively connected. The tapered interface of surface 116 and surface 114 are thinner than the main body of the membrane allowing the membrane 110 to have the same thickness across the entire area of membrane coverage.

In certain embodiments, membrane 110 further comprises a raised area 140 that includes electrical second portion comprising electrical contacts 134 and 136 on the exterior of the membrane 110 top surface as shown. In the embodiment shown in FIG. 1A, the raised area 140 allows water and other environmental elements such as dust, dirt and debris to be washed away from the electrical contact area and down off of the roof. This allows contacts 134 and 136 to have an exposed contact area flush with the surface of membrane 110, simplifying electrical connections to contacts 134 and 136.

Partially embedded structural member 124 as shown in FIG. 1A includes an embedded portion 122 along with a mechanical second portion exterior portion 120 that is completely outside of the membrane. In certain embodiments, the exterior portion 120 of the structural member 124 forms a loop that allows the mechanical connection of a shingle to the membrane 110.

The electrical first portion comprises insulated electrical conductors 130 and 132, which may be comprised of one or more of electrically conductive materials including alloys of copper, aluminum, nickel, stainless steel, silver, graphite, tungsten, carbide or combinations thereof. In an embodiment, the conductors may be a busway or busbar rather than electrical wiring. The conductors 130 and 132 may also be flexible. Electrical wires 102 are connected to conductors 130 and 132 and extend outside of membrane 110 to an electrical circuit. The electrical circuit may be inside a building covered by a roof structure.

Figure 1B:
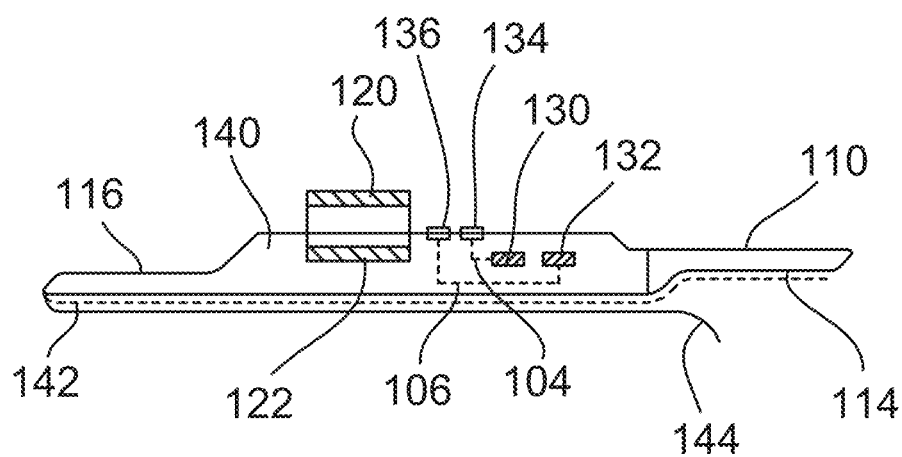
FIG. 1B is a section view from an end view vantage point of a membrane.

FIG. 1B is a section view from an end view vantage point of membrane 110. Tapered top surface 116 and bottom tapered surface 114 are shown. In certain embodiments, both of these surfaces may have adhesive placed on the surface to allow multiple membranes to be adhesively connected together. Adhesive 142 may be placed on the entire bottom surface of membrane 110 and have a protective backing material 144 that is removed at a time of installation, exposing the adhesive 142. In other embodiments the adhesive 142 may cover portions of one or more surfaces of the membrane 110.

In the embodiment shown, raised area 140 may include both electrical contacts 134 and 136 along with structural embedded portion 122. In other embodiments the raised area 140 may include only electrical contacts 134 and 136 and the embedded portion may be at a lower level not included in the raised area. Exterior portion 120 of the structural member is also shown in this embodiment. Electrical conductors 104 and 106 are shown connecting insulated electrical conductors 130 and 132 to electrical contacts 134 and 136.

Figure 1C:
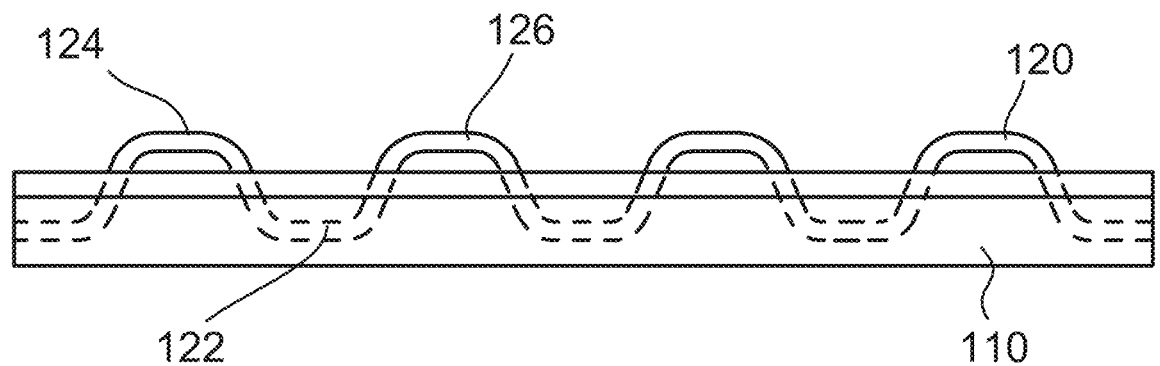
FIG. 1C is a section view from a side view vantage point of a membrane.

FIG. 1C is a section view from a side view vantage point of membrane 110. This embodiment illustrates how partially embedded structural member 124 forms a loop 126 on the exterior portion 120 of the structural member 124. Structural embedded portion 122 is also shown completely embedded inside the membrane 110.

Figure 1D:
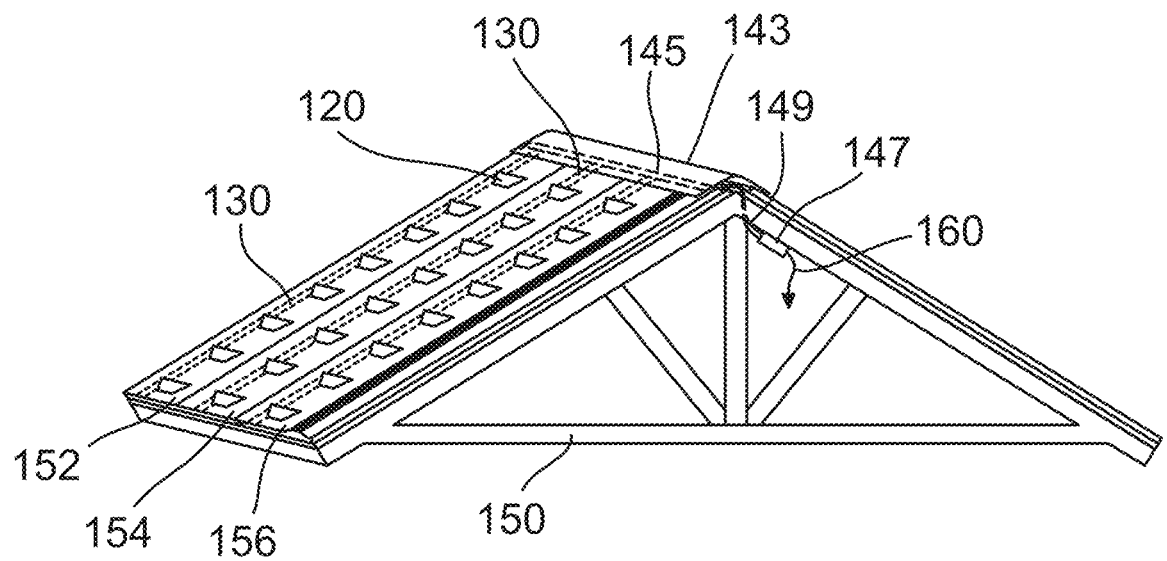
FIG. 1D is an isometric view of a roof with vertical membranes installed on the surface of a roof.

FIG. 1D is an isometric view of a roof with vertical membranes installed on the surface of roof 150. Three membranes 152, 154 and 156 are installed on the roof 150 surface as shown. In this embodiment, each of the three membranes 152, 154 and 156 are placed on roof 150 running from top ridge 143 and extending down to a bottom edge near the soffit, rain gutter or drip edge. The exterior portion 120 of the structural member is shown exposed on the top surface of the membrane. Insulated electrical conductors 130 are shown running parallel within each membrane. In this embodiment, membranes 152, 154 and 156 are electrically connected to membrane conductors 145 that run parallel with the roof ridge 143. Electrical wiring 149 extends from the membrane conductors 145 to electrical junction box 147 in attic. Wiring 160 extends this circuit to an electrical circuit inside a building below the roof.

Figure 1E:
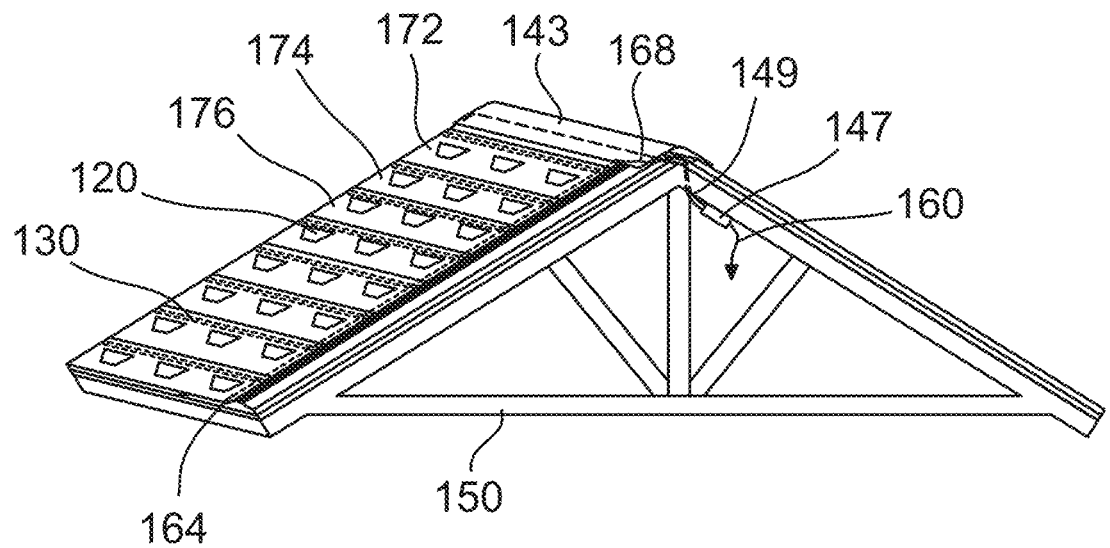
FIG. 1E is an isometric view of a roof with horizontal membranes installed on the surface of a roof.

FIG. 1E is an isometric view of a roof with horizontal membranes installed on the surface of roof 150. Three membranes 152, 154 and 156 are installed on the roof 150 surface as shown. In this embodiment, each of the three membranes 172, 174 and 176 are placed on roof 150 running parallel to the top ridge and parallel to the roof drip edge. The exterior portion 120 of the structural member is shown exposed on the top surface of the membrane. Insulated electrical conductors 130 are shown running parallel within each membrane. In this embodiment, membranes 172, 174 and 176 are electrically connected to membrane conductors 164 that run perpendicular to membranes 172, 174 and 176. Electrical wiring 168 extends from the membrane conductors 164 to electrical junction box 147 in attic. Wiring 160 extends this circuit to an electrical circuit inside a building below the roof.

FIG. 2A is a top view of three membranes connected together. In order to provide support for the installation of solar shingles over an entire roof area, multiple membranes may be placed in multiple rows (either horizontally as shown in FIG. 1E or vertically in FIG. 1D) as needed to cover a larger area. In this embodiment, three parallel membranes 216, 218 and 220 are shown connected together. Overlap area 207 shows how the right edge of membrane 216 overlaps the left edge of membrane 218, for example. Insulated electrical conductors 130 and 132 are shown embedded within each membrane.

In this embodiment, embedded portion 122 along with exterior portion 120 are shown running parallel with each membrane. In certain embodiments, the membrane is semi-flexible and may be rolled-up prior to installation. The membrane may then be un-rolled at the time of installation. In this embodiment, the structural member may run parallel to the direction of the long length of membrane material so that it can be rolled up and un-rolled for installation as required. Each membrane may be adhesively attached to the roof surface in turn. For example, membrane 220 may be installed first and be adhesively attached to a roof surface. After that, membrane 218 may then be adhesively attached to the roof with overlap area 207 of membrane 218 being adhesively attached to membrane 220 forming a seal between the two membranes. Top surface 116 and bottom surface 114 may interface with adjacent membranes if needed.

As shown in this embodiment, membranes 216, 218 and 220 are running vertically with the roof similar to what is illustrated in FIG. 1D. In this example embodiment, each of the membranes 216, 218 and 220 have a center section 205 that is depressed and lower than the main body of the membrane to allow for water flow. This allows for rain water to shed towards this trough area and away from the main surface area of each membrane. This also may encourage debris and dust to be washed down and away from the membrane by rain water. Overlap area 207 is also configured as a trough which is lower than the rest of the membrane.

FIG. 2B is a section view of three membranes connected together. In this embodiment, three membranes 216, 218 and 220 are shown connected together. Overlap area 207 shows how the right edge of membrane 216 overlaps the left edge of membrane 218, for example. Insulated electrical conductors 130 and 132 are shown embedded within each membrane. Raised area 140 is also shown. Embedded portion 122 along with exterior portion 120 are shown In this embodiment, membrane 220 may be installed first and be adhesively attached to a roof surface. After that, membrane 218 may then be adhesively attached to the roof with overlap area 207 of membrane 218 being adhesively attached to membrane 220 forming a seal between the two membranes. Top surface 116 and bottom surface 114 may interface with adjacent membranes. Each of the membranes 216, 218 and 220 may have a center section 205 that is depressed and lower than the main body of the membrane to allow for water flow. Overlap area 207 is also configured as a trough which is lower than the rest of the membrane.

Figure 3:
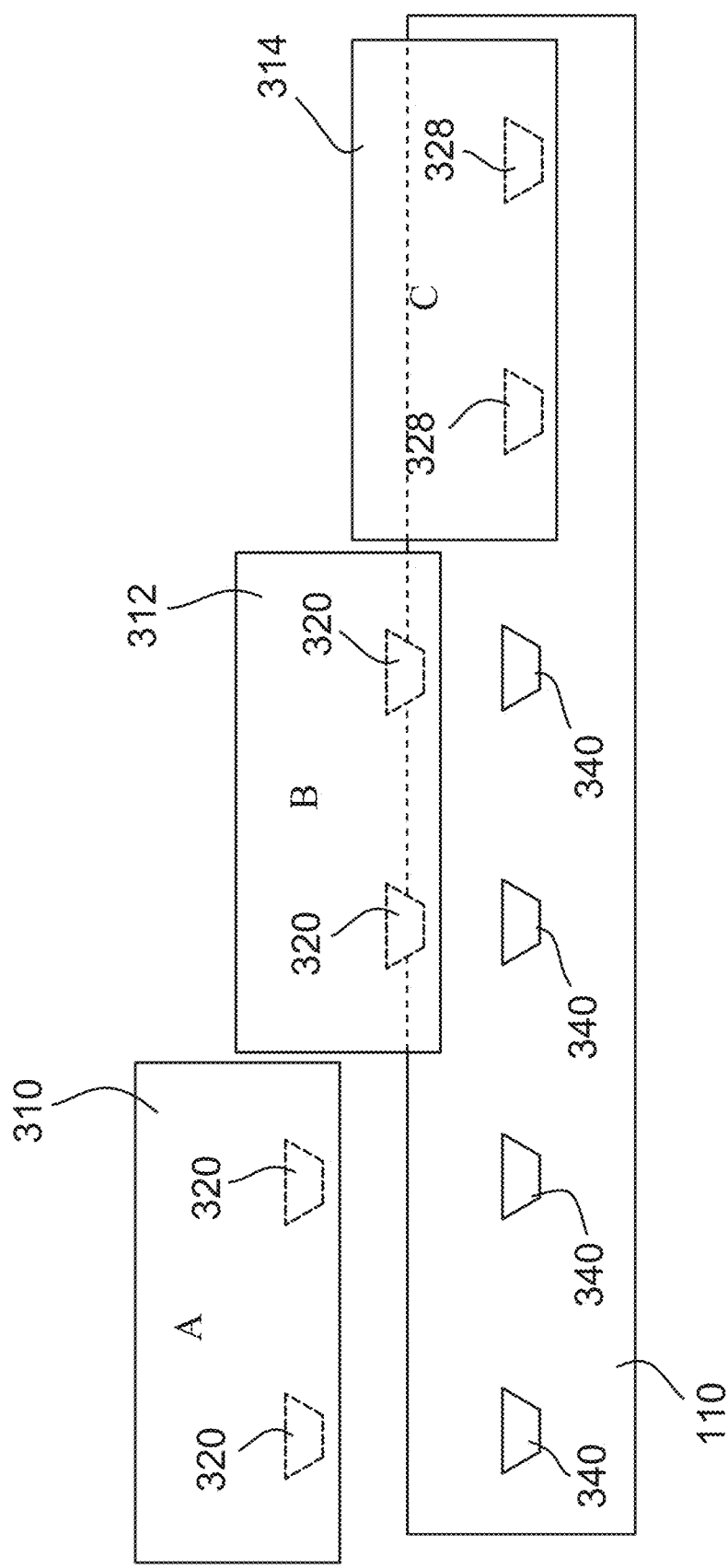
FIG. 3 is an illustration of a membrane with three shingles being installed in order.

FIG. 3 is an illustration of a membrane with three shingles being installed in order. Membrane 110 is shown with structural loops 340 ready to receive the insertion of shingles 310, 312 and 314. Shingle 310 and 312 are demonstrating how they are approaching membrane 110 during installation. Mechanical connection clasps 320 are ready to engage with loops 340 as they are approaching connection. Loops 340 are wedge shaped to allow clasps 320 to align with the insertion point as needed. Shingle 314 is fully inserted and the clasps 328 are fully engaged with the loops. Clasps 328 may have a mechanism that locks shingle 314 into place once fully inserted. Clasp 328 may also have a mechanical release that allows for shingle 314 to be removed if needed in the future. In some cases, one or more shingles may receive damage or otherwise may need to be replaced. A releasing mechanism may allow a shingle to be removed and replaced with a new shingle. In other embodiments, a clasping and release mechanism may reside on the structural loop 340 allowing shingles to be connected. In this example, a loop or similar structural component may be located on the shingle allowing connection to a clasp on the membrane structure.

Figure 4:
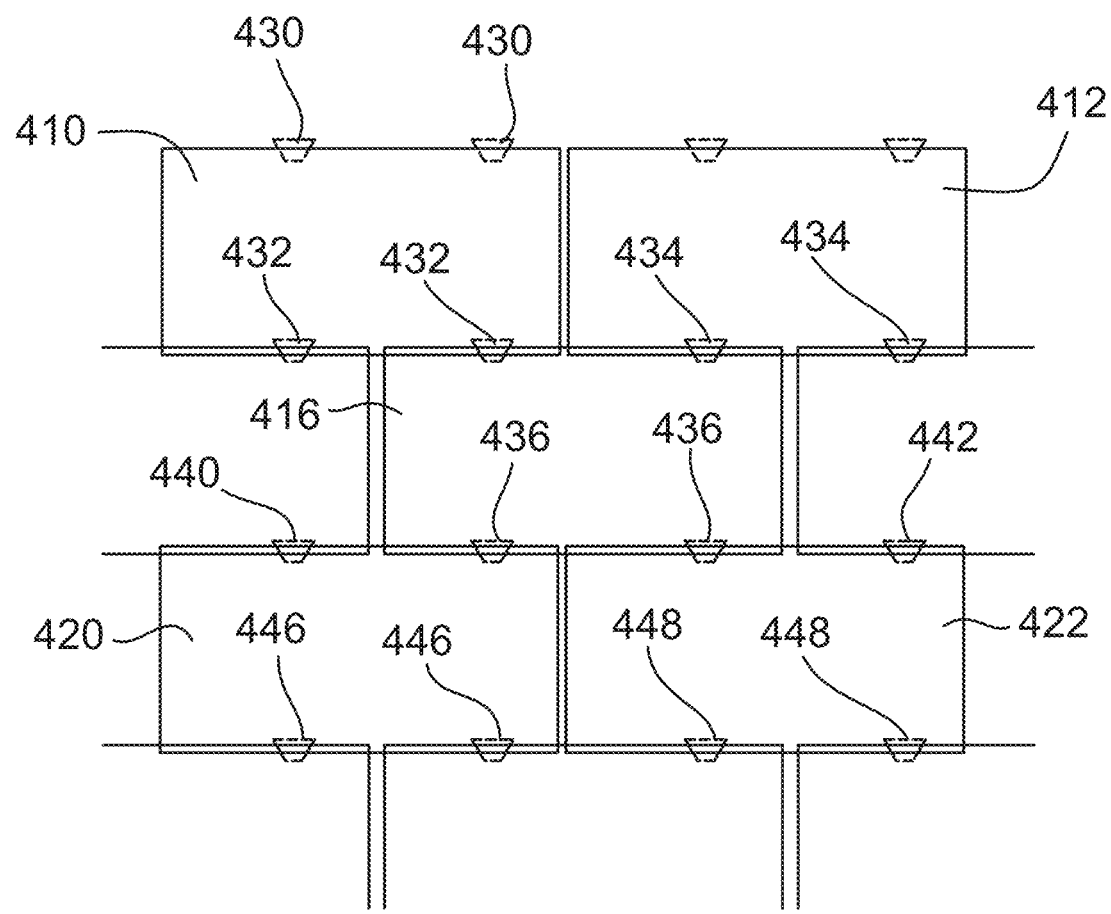
FIG. 4 is an illustration of several shingles connected together on top of a membrane.

FIG. 4 is an illustration of several shingles connected together on top of a membrane. Shingle 410 is mechanically connected to structural loops 430 at the top and structural loops 432 at the bottom of the shingle 410. Shingle 412 is connected with structural loops 434 at the bottom of shingle 412. Structural loop 432 and loop 434 also connect to shingle 416. In this way, each structural loop may engage with more than one shingle. Each shingle may have a mechanical clasp that allows more than one shingle to attach to a single loop. Adjacent shingles may also overlap with structural loops holding them in the proper overlapping position as required. Shingle 416 shares connections 436 with shingles 420 and 422. Shingle 420 has shared connections to loop 440, loop 436 and loops 446. Shingle 422 has shared connections with loop 436, loop 442 and loops 448.

Figure 5:
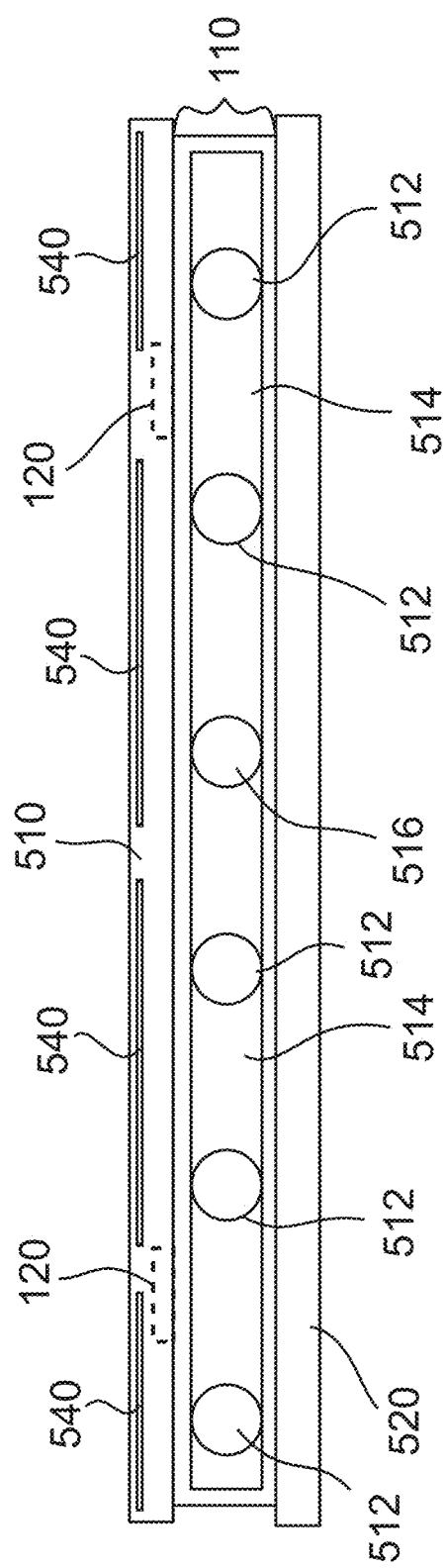
FIG. 5 is a section view of a membrane on a roof surface with a shingle on top of the membrane.

FIG. 5 is a section view of a membrane on a roof surface with a shingle on top of the membrane. Membrane 110 has piping embedded inside the membrane to allow for air flow through the membrane. This airflow keeps the shingles cool by allowing fresh air to be drawn in from the lower edge of the membrane and commuted upwards towards the ridgeline where the hot air may be vented out of vents along the ridgeline. Pipes 512 are inside the membrane 110 as shown. Airflow may enter the inside space 516 of the piping as required. Air may also enter the space 514 between piping 512.

In certain embodiments, solar cells 540 may be embedded in electrical shingle 510. Electrical shingle 510 may be a solar shingle in an embodiment. Airflow below the solar shingle may enhance the performance of the solar cells by keeping the backside of the solar cells 540 cooler. Structural loop exterior portions 120 are also shown which secure the shingle 510 to the membrane 110. Membrane 110 is structurally connected to roof structure 520. The membrane 110 may be adhesively attached to the roof surface. In other embodiments, the membrane may be structurally attached by other connection systems such as screws, clips, clasps, tracks, grooves or other structural means.

Figure 6:
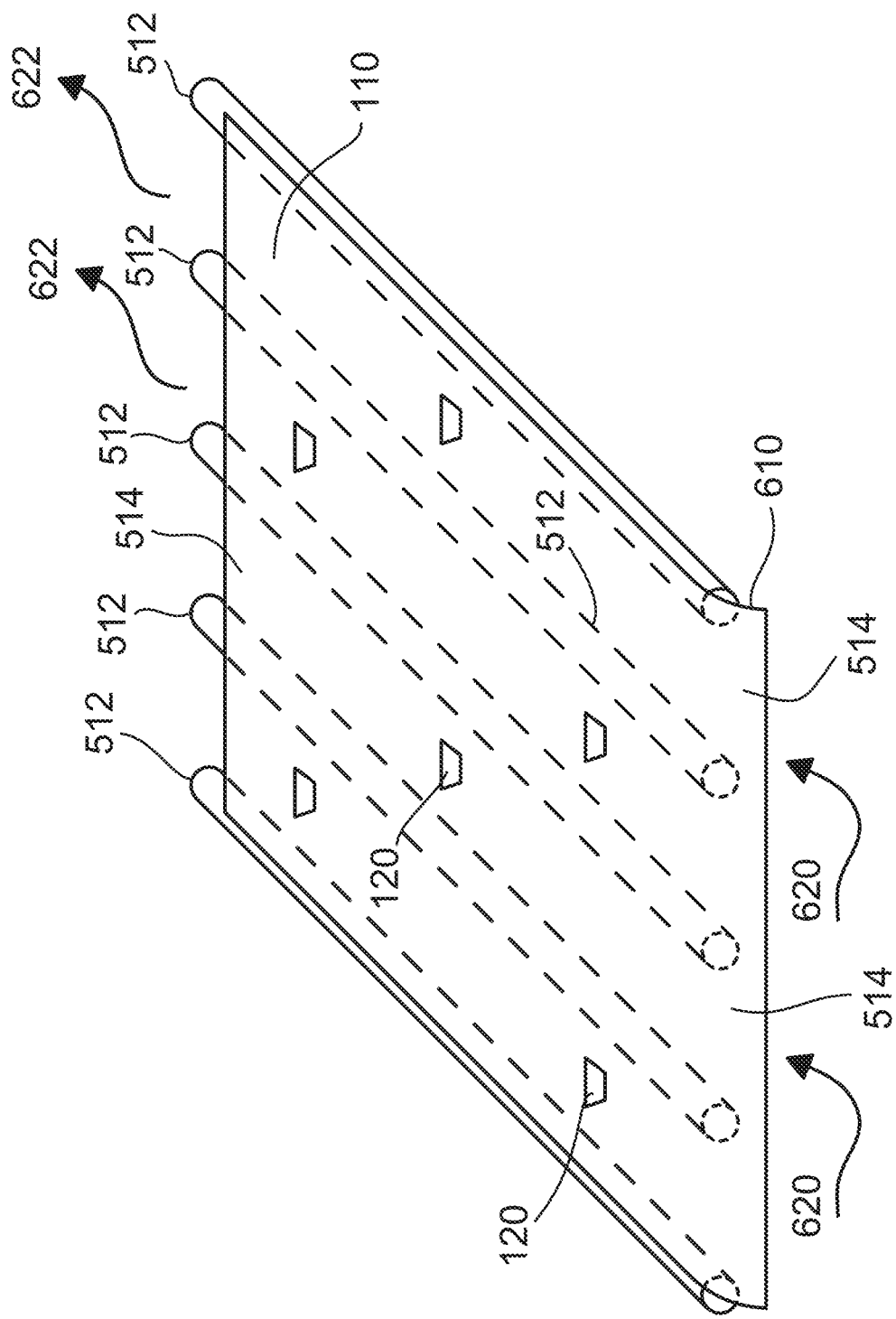
FIG. 6 is an isometric view of a membrane with piping.

FIG. 6 is an isometric view of a membrane with piping. Air piping channels 512 run from the lower edge of the membrane 110 near the drip edge of a roof up towards the ridgeline of the roof. Airflow 620 enters the lower end of piping channel 512 at the bottom opening of the air piping channels 512 and the air is transmitted by natural heat convection up and out the top opening of air piping channel 512. Heated air 622 is vented out of the air piping channel 512, and air gap channel 514 between the air piping channel 512 to the outside air via venting along the upper ridgeline of a roof. Structural loop exterior portions 120 are also shown. The solar shingles mechanically attach to the mechanical second portion and electrically connect to the electrical second portion at the exterior portion 120 locations as shown.

In some cases, wind may create an uplift at the lower edge of membrane 110, causing uplift and potentially causing damage to the membrane 110 or even possibly removing the entire membrane (or sections of it) from the roof. To prevent this uplift, the top layer of the membrane 110 may be configured with a shielding 610 at the lower edge of membrane 110 near the rain gutter and drip edge. In this way, the open ends of the piping 512 along with the space 514 between piping 512 may be protected from direct air flow from the wind. The shielding may be configured to either redirect the airflow or disturb and dissipate the energy of the airflow to reduce the velocity of the flow into the space under the shingles.

Figure 7:
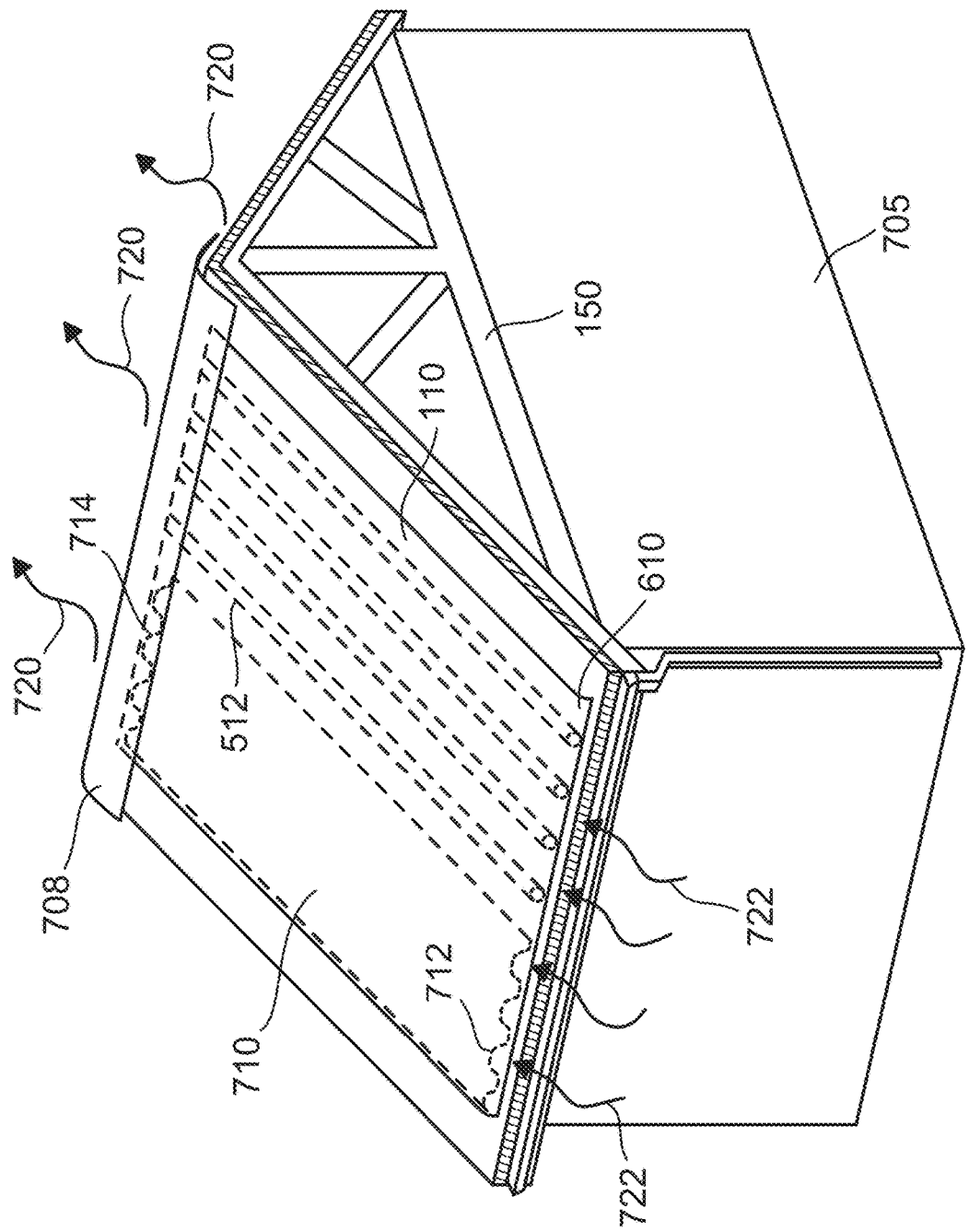
FIG. 7 is an isometric view of a building with the air flow version of the membrane installed on a roof.

FIG. 7 is an isometric view of a building 705 with the air flow version of the membrane installed on the roof 150. Cool air 722 is drawn in at the lower edge of membrane 110 and drawn up through the piping 512 to the top ridge 708 and the now heated air 720 is vented out through venting along the ridgeline 708. Wind shielding 610 is also shown. A corrugated airflow membrane (CAM) 710 is also shown. The shape of the CAM 710 also creates channels for the airflow to transmit up from the bottom edge 712 of the CAM 710, up through the membrane 710 and to the ridgeline 708 venting above.

Figure 8:
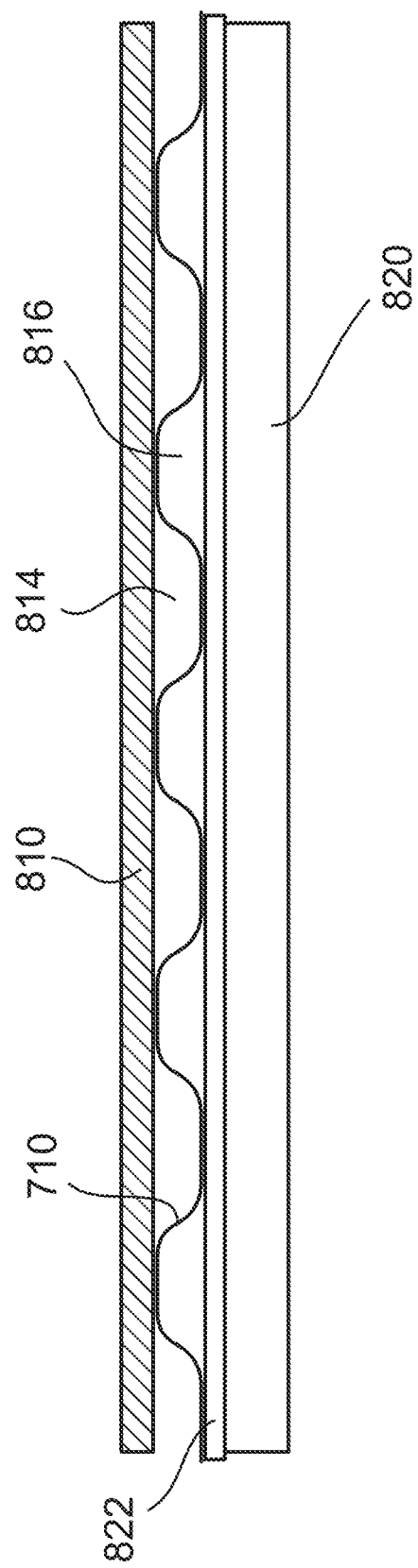
FIG. 8 is a section view of the corrugated airflow membrane (CAM).

FIG. 8 is a section view of the corrugated airflow membrane (CAM). CAM 710 is shown with shingle 810 mounted to the top of the CAM 710. The CAM 710 is also structurally attached to roof sheeting 822 which is in turn structurally attached to roof structure 820. At least two air gap channels are shown as air gap channel 814 and air gap channel 816. Air gap channel 814 directs air flow above CAM 710 and air gap channel 816 directs air flow below CAM 710 as shown.

Figure 9A:
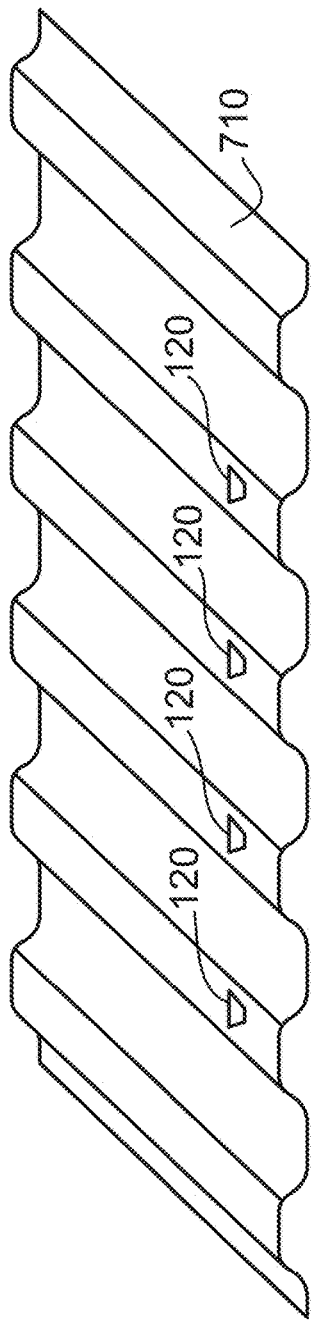
FIG. 9A is an isometric view of the CAM.

FIG. 9A is an isometric view of the CAM 710. Structural loop exterior portions 120 are also shown. In this embodiment, the membrane itself is structured in a corrugated shape in order to allow for airflow above and below each section of the CAM 710.

Figure 9B:
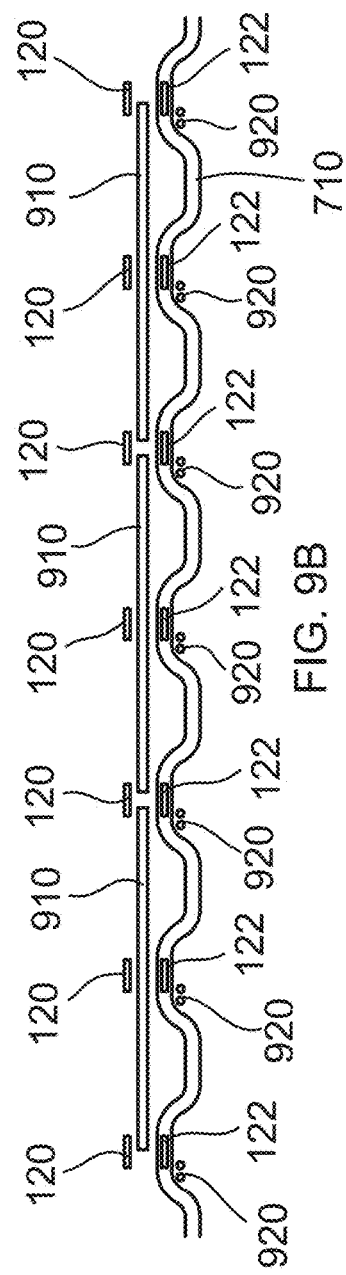
FIG. 9B is a section view of the CAM showing exterior portions along with embedded sections of the structural member.

FIG. 9B is a section view of the CAM 710 showing Structural loop exterior portions 120 along with embedded sections 122 of the structural member. shingles 910 are also shown. In this example embodiment, insulated electrical conductors 920 are conformally attached to the bottom surface of the CAM 710.

Figure 9C:
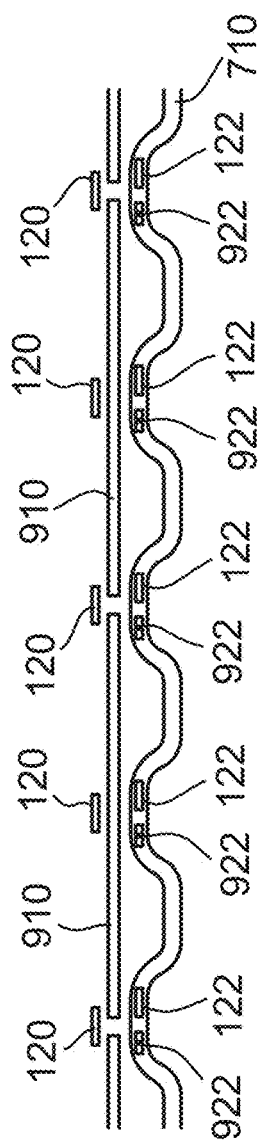
FIG. 9C is a section view of a second embodiment of the CAM showing exterior portions along with embedded sections of the structural member.

FIG. 9C is a section view of a second embodiment of the CAM 710 showing Structural loop exterior portions 120 along with embedded sections 122 of the structural member. Shingles 910 are also shown. In this example embodiment, insulated electrical conductors 922 are embedded inside of the CAM 710.

Figure 10A:
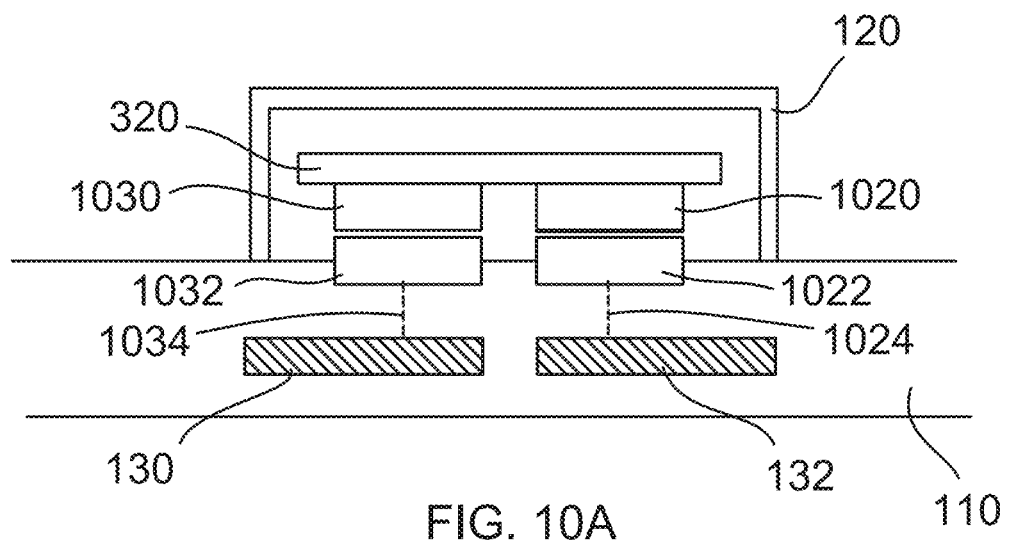
FIG. 10A is a section view of the structural loop exterior portion with clasping mechanism and electrical contacts.

FIG. 10A is a section view of the structural loop mechanical second portion exterior portion 120 with clasping mechanism and electrical contacts. In this embodiment, the electrical contacts 1020 and 1030 are embedded in the clasping mechanism 320 of a solar shingle. Electrical connections are made between solar shingle contact 1030 and membrane contact 1032. Likewise, solar shingle contact 1020 makes an electrical connection with membrane contact 1022. Electrical wire 1034 connects membrane contact 1032 to insulated electrical conductor 130. Electrical wire 1024 connects membrane contact 1022 to insulated electrical conductor 132. This embodiment demonstrates how the electrical connections may be incorporated within the clasping mechanism. The electrical connections may also be within the structural loop. The solar shingles mechanically connect to the roofing underlayment by and electrically connect to the roofing underlayment.

Figure 10B:
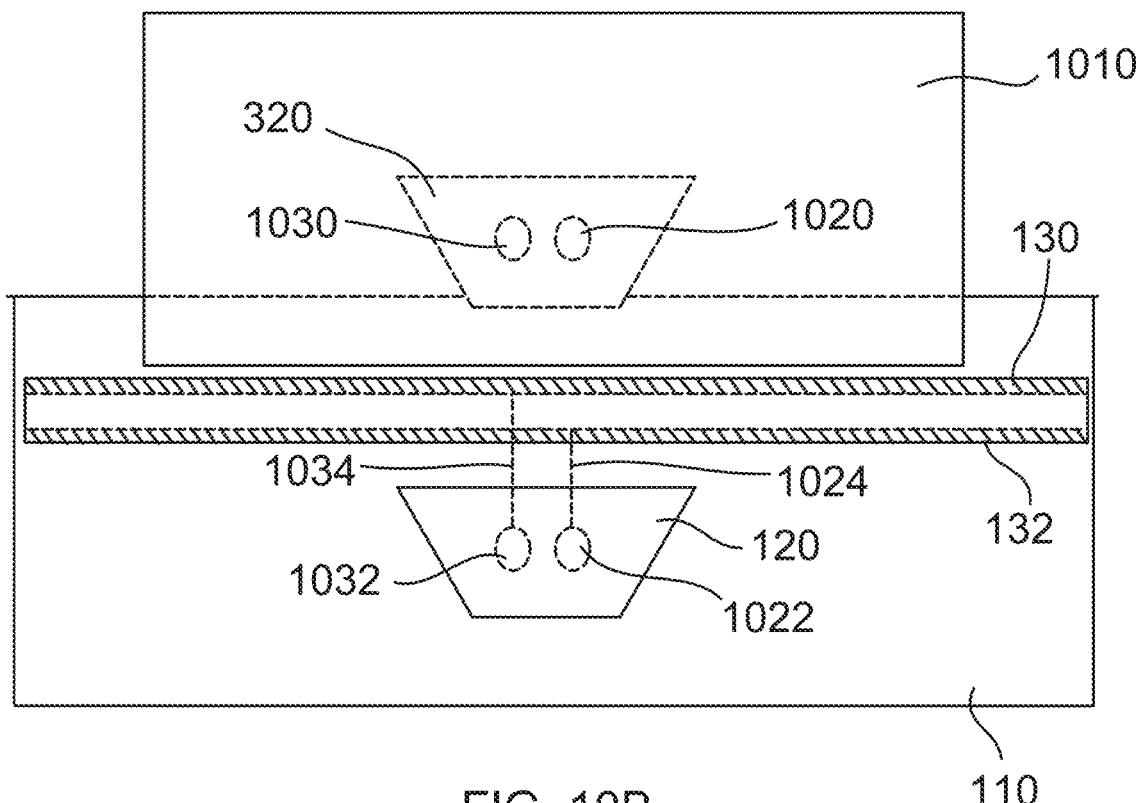
FIG. 10B is an overhead view of a shingle aligning with a membrane.

FIG. 10B is an overhead view of a shingle 1010 aligning with membrane 110. The structural loop exterior portion 120 is shown on top of membrane 110. In this embodiment, the electrical contacts 1020 and 1030 are embedded in the clasping mechanism 320 of a shingle. Shingle contact 1030 aligns with membrane contact 1032. Likewise, shingle contact 1020 aligns with membrane contact 1022. Electrical wire 1034 connects membrane contact 1032 to insulated electrical conductor 130. Electrical wire 1024 connects membrane contact 1022 to insulated electrical conductor 132.

Figure 11A:
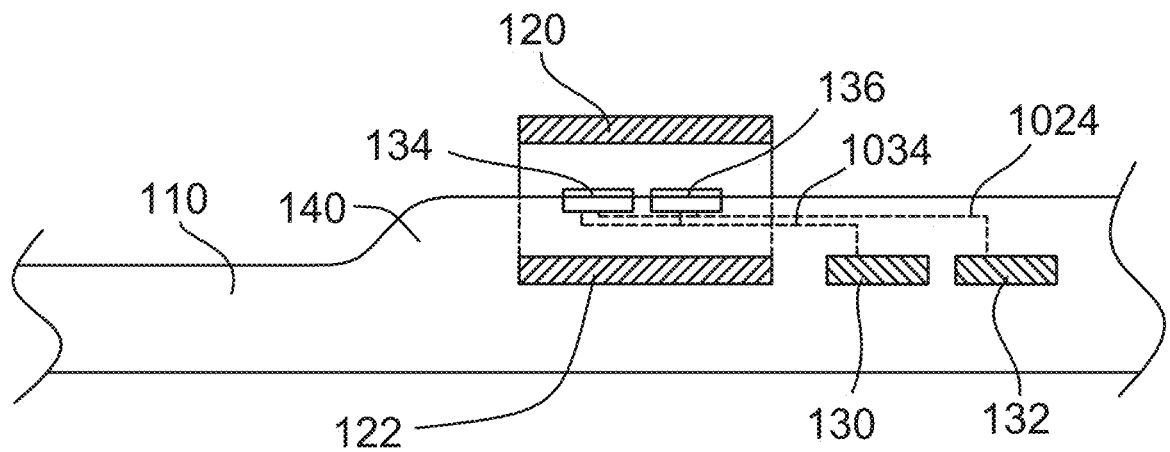
FIG. 11A is a cross section view of membrane.

FIG. 11A is a cross section view of membrane 110. The structural loop exterior portion 120 and embedded portion 122 is shown. In this embodiment, the membrane contacts 134 and 136 are embedded in the membrane 110 below exterior portion 120 of shingle 110. Electrical wire 1034 connects membrane contact 1032 to insulated electrical conductor 130. Electrical wire 1024 connects membrane contact 1022 to insulated electrical conductor 132. Raised area 140 is at a higher level than the rest of the membrane providing a "high point" for water and other material from entering the electrical connection point of the connector. The raised area 140 sheds water away from the contacts 134 and 136.

Figure 11B:
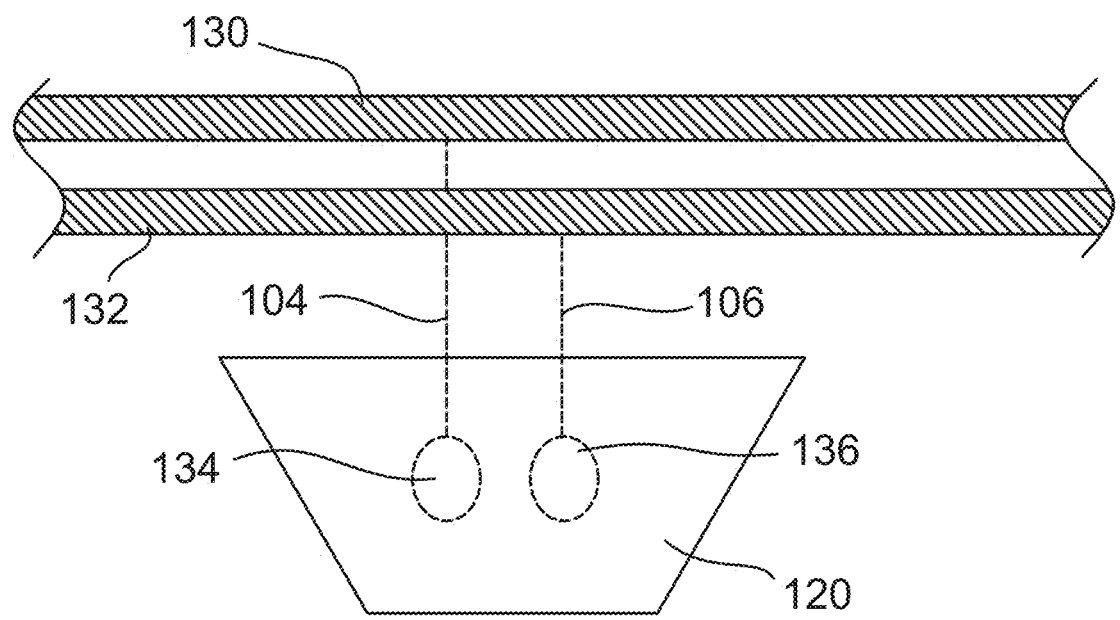
FIG. 11B is an overhead view of a mechanical/electrical connector with connections to the embedded electrical conductor.

FIG. 11B is an overhead view of a mechanical/electrical connector with connections to the embedded electrical conductor. Electrical contacts 134 and 136 are shown below exterior portion 120. Embedded electrical conductors 130 and 132 are electrically connected to connector electrical contacts 134 and 136 via interconnecting wiring 104 and 106.

Figure 12A:
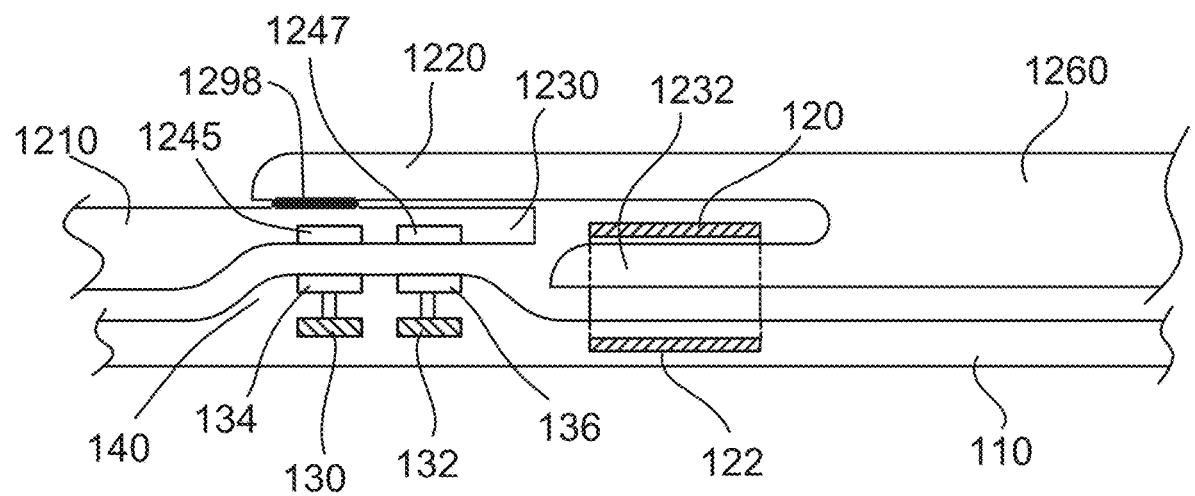
FIG. 12A is a side section view of mechanical/electrical connector inside a membrane with solar shingles connected to the membrane.

FIG. 12A is a side section view of mechanical/electrical connector inside a membrane with solar shingles connected to the membrane. First Shingle 1210 has electrical contacts 1245 and 1247 embedded along the edge of the first shingle 1210. Contacts 1245 and 1247 electrically connect to membrane contacts 134 and 136. Contacts 134 and 136 are electrically connected to electrical conductors 130 and 132 as shown. Second shingle 1260 is mechanically attached to membrane 110 via mechanical exterior portion 120. Bottom lip 1232 of second shingle 1260 mechanically holds the second shingle 1260 in place by sliding in under exterior portion 120. Upper lip 1220 of second shingle 1210 overlaps top section 1230 of first shingle 1210 allowing water to run off and not enter the connection area below. Waterproof seal 1298 may also be provided, preventing water from entering the electrical connection below. Embedded portion 122 is also shown. Raised area 140 as shown in this example is raised and at a level higher than both attached shingles. Embedded electrical conductors 130 and 132 are electrically connected to connector electrical contacts 134 and 136.

Figure 12B:
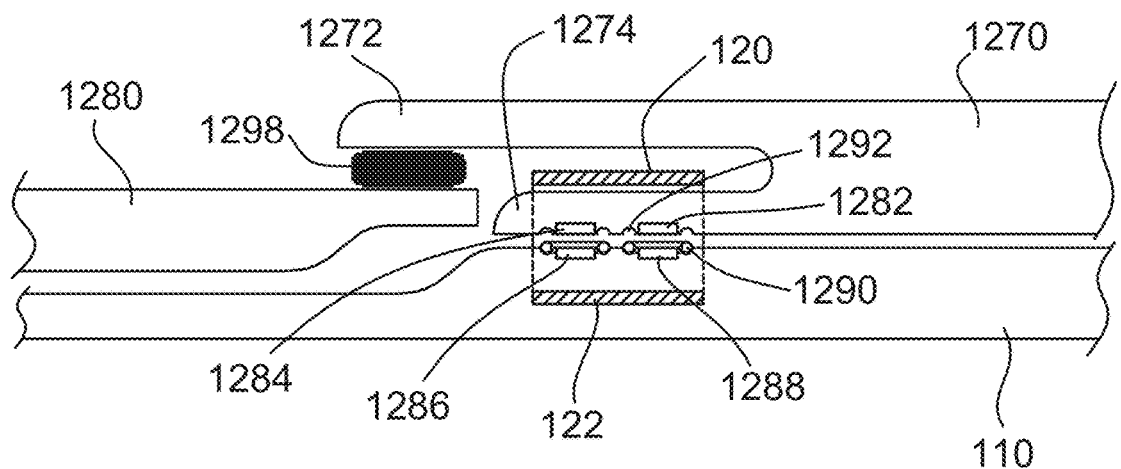
FIG. 12B is a side section view of another embodiment of a mechanical/electrical connector.

FIG. 12B is a side section view of another embodiment of a mechanical/electrical connector. In this example, first shingle 1280 sits on top of membrane 110. Second shingle 1270 has an overlap section 1272 that lays on top of first shingle 1280 providing both mechanical support to hold first shingle 1280 in place and also provides a waterproof seal 1298 preventing water from entering the electrical connection below. Second shingle 1270 is mechanically attached to membrane 110 via lower lip 1274 inserted into mechanical exterior portion 120. Electrical contacts 1282 and 1284 are embedded in second shingle 1270 and electrically connect to membrane contacts 1286 and 1288. Waterproof seal 1290 may also be provided to prevent water penetration into the electrical connection area. Watertight seal gasket allowance features 1292 may also be provided to allow for a tight connection of the waterproof seal 1290 between the second shingle 1270 and the membrane 120. Embedded portion 122 is also shown.

FIG. 13A is a side view section of multiple solar shingles attached to the membrane with an air gap between the shingles and the membrane. Shingles 1320 are held in place by mechanical/electrical connectors 1310. Air flow 1330 is shown passing through each connector 1310 and between the air gap 1350 between the shingles 1320 and the membrane 110. Embedded portion 1340 of connector 1310 is also shown.

FIG. 13B is an overhead view of two shingles with connectors. Connectors 1310 are shown at the exterior corners of shingles 1320. Middle connectors 1312 are shown which provide additional mechanical and electrical redundancy in case of any failure to the connectors 1310. Air flow 1330 is shown passing under the solar shingles 1320. Air flow below the shingles allows the shingles to perform at their highest efficiency. It is known that the cooler the back of the shingles, the more efficient the power output of the shingles.

FIG. 13C is a perspective drawing of a mechanical/electrical connector. Membrane 110 is shown with mechanical/electrical connector 1310, exterior portion 1342 and embedded portion 1340. Air holes 1380 may be provided in the connector 1310 to allow air flow 1330 through the connector 1310.

Figure 14A:
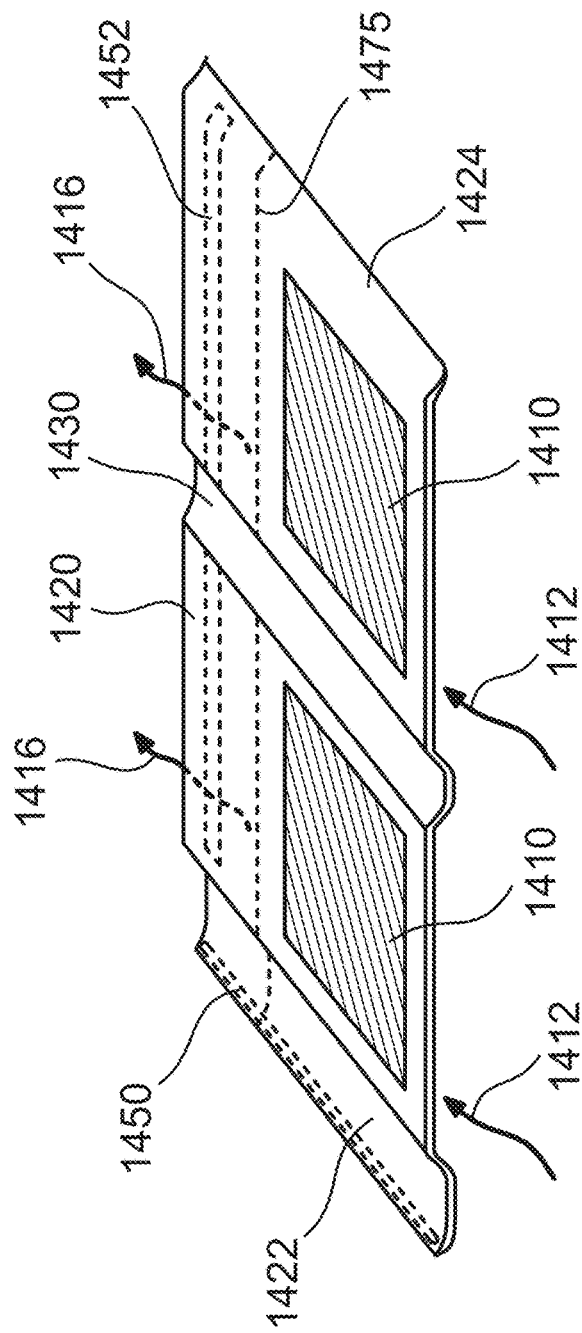
FIG. 14A is an isometric view of a solar shingle with air gap.

FIG. 14A is an isometric view of a solar shingle with air gap channel. Solar Shingle 1420 as shown in this illustration demonstrates an embodiment of the invention wherein the shape of the solar shingle 1420 allows cool air flow 1412 to be drawn in at the lower part of the shingle by the heated air 1416 that is heated by the solar heat energy being collected by the solar heat during the day when the sun is out. The solar Photovoltaic (PV) modules 1410 on a top surface of the solar shingle 1420 produce electrical power and also conduct heat from the top surface of solar shingle 1420 and transmit this heat to the air flow 1412 and heated air 1416. The natural convection of heat below the shingle draws air in at the bottom of the shingle and carries the heated air to the top of the solar shingle 1420.

In the embodiment shown in FIG. 14A, the left side of the solar shingle 1420 has a receiving edge 1422 along with an inserting edge 1424 on the right side of the solar shingle 1420 as shown. The receiving edge 1422 has waterproof sealant 1450 the adhesively attaches to an inserting edge of an adjacent shingle. An overlapping area 1475 is shown that allows for one or more shingles in a row above solar shingle 1420 to be placed partially covering solar shingle 1420 in the overlapping area 1475. Waterproof sealant 1452 adhesively attaches to the overlapping shingle or shingles forming a waterproof seal between the rows of shingles preventing air flow and water penetration between the overlapping shingles. Rows of shingles may be vertically staggered allowing channel 1430 to align with a combined receiving edge and inserting edge created channel of an overlapping row of shingles to be placed on top of the channel 1430. This combined channel aligns with channel 1430 and allows each row of shingles to be staggered and still have the channels align as the rows of shingles are overlapped on top of each other during installation. The combined channel 1460 as shown in FIG. 14B is created when two adjacent shingles are connected together on their sides.

Figure 14B:
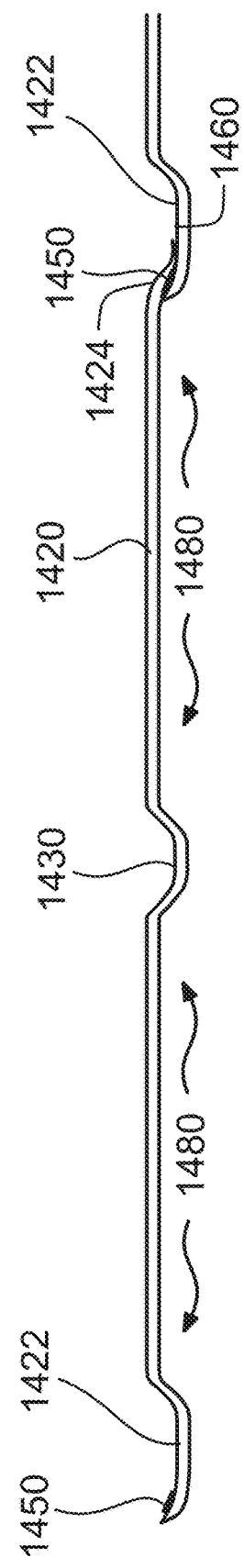
FIG. 14B is a side view of a solar shingle with air gap.

FIG. 14B is a side view of a solar shingle with air gap. Solar shingle 1420 is shown with channel 1430 and air gap channel 1480 below the shingle. Combined channel 1460 is created when two adjacent shingle are connected together by placing the inserting edge 1424 of a first shingle on to a receiving edge 1422 of an adjacent shingle. Waterproof sealant 1450 seals the connection between the inserting edge 1424 of a first shingle and a receiving edge 1422 between two adjacent shingles.

Figure 14C:
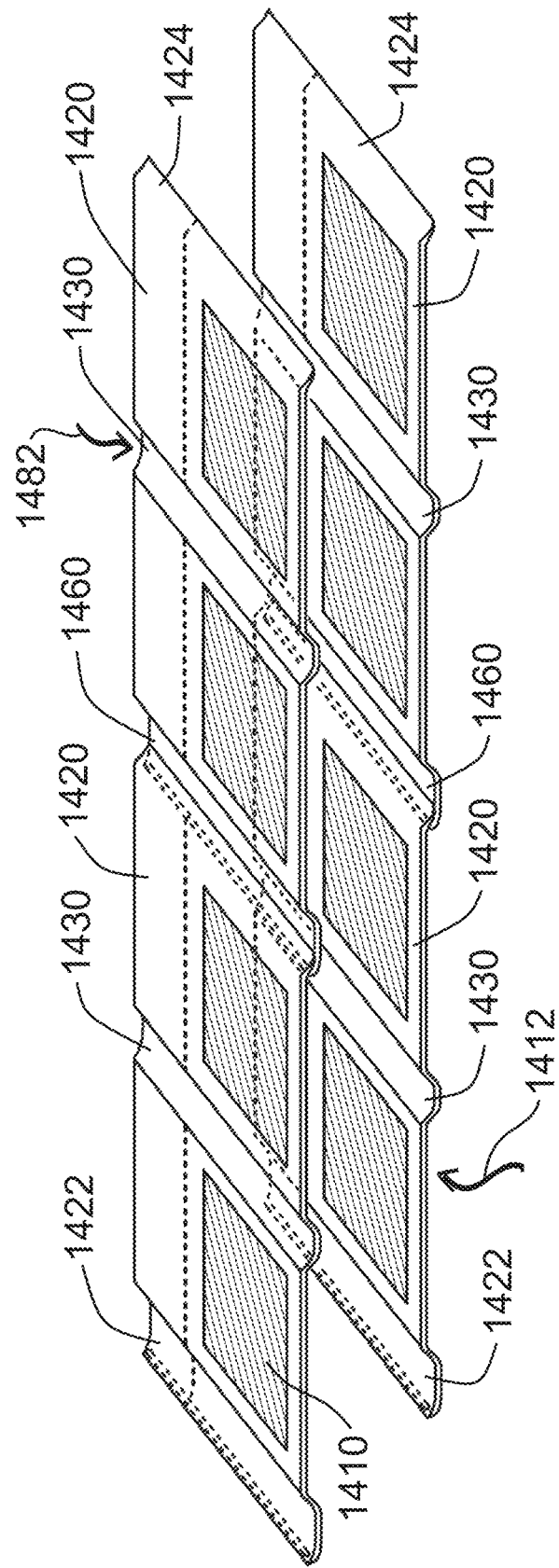
FIG. 14C is an illustration of two rows of shingles on a roof.

FIG. 14C is an illustration of two rows of shingles on a roof. Two rows of solar shingles 1420 are shown with combined channels 1460 aligning with channels 1430 of the overlapping row as shown. Inserting edges 1424 and receiving edges 1422 are shown on the ends of the rows of shingles. Air flow 1412 is shown entering the air gap channel below solar shingle 1420. Water 1482 is shown entering the channel 1430 which then runs down to the lower row of shingles and continues flowing into combined channel 1460. Each solar shingle 1420 sheds water away from the PV modules 1410 into the channels 1430 and combined channels 1460.

Figure 15A:
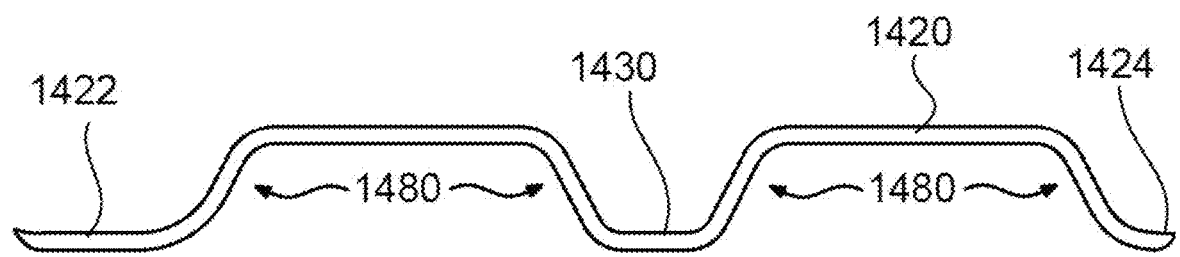
FIG. 15A is an end view of a solar shingle with air gap.

FIG. 15A is an end view of a solar shingle with air gap. Two air gaps 1480 are shown below the bottom surface of the solar shingle 1420. Inserting edge 1424 and receiving edge 1422 are shown. Channel 1430 is shown between the two air gaps 1480. In this embodiment, the natural convection of heat below the bottom surface of the shingle draws air through the air gaps 1480. In many cases, the cooling effect of this air flow will keep the bottom surface of the solar shingle cooler, thus increasing the efficiency of the power production and extending the functional life of the solar shingle. Heat degrades the performance of the solar shingle 1420.

Figure 15B:
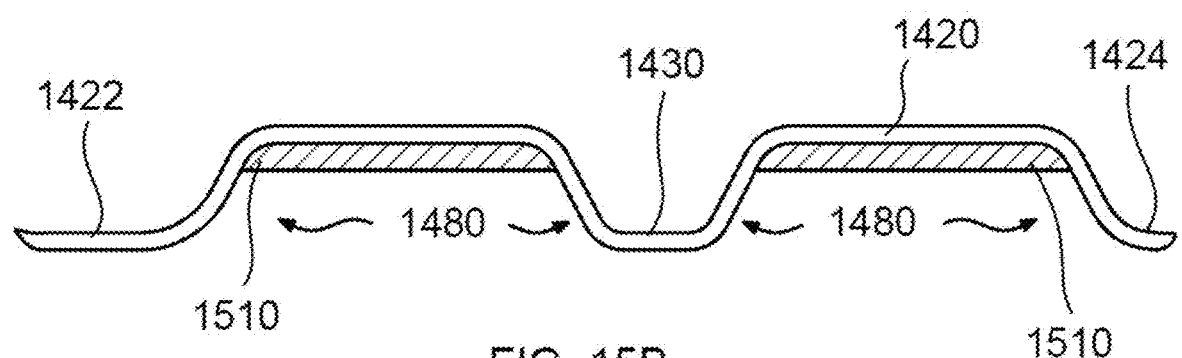
FIG. 15B is an end view of a solar shingle with a phase change material layer and air gap.

FIG. 15B is an end view of a solar shingle with a phase change material layer and air gap channel. Two air gaps channels 1480 are shown below the bottom surface of the solar shingle 1420. A first layer of phase change material 1510 is shown on the bottom of the solar shingle 1420 and above the air gap channel 1480. Inserting edge 1424 and receiving edge 1422 are shown. Channel 1430 is shown between the two air gaps channels 1480. The first layer PCM 1510 is configured to change during wintertime temperatures of 5 degrees Celsius and lower. The bottom surface of solar shingle 1420 in contact with the first layer PCM 1510 may further have a heat reflective material or coating that directs heat away from the bottom surface and towards the air gap channel. This heat reflective material may be included in all embodiments with or without phase change materials. In every case where this heat reflective material is used, the heat is directed away from the bottom surface of the solar shingle 1420 which increases the energy production efficiency of the solar shingle.

Figure 15C:
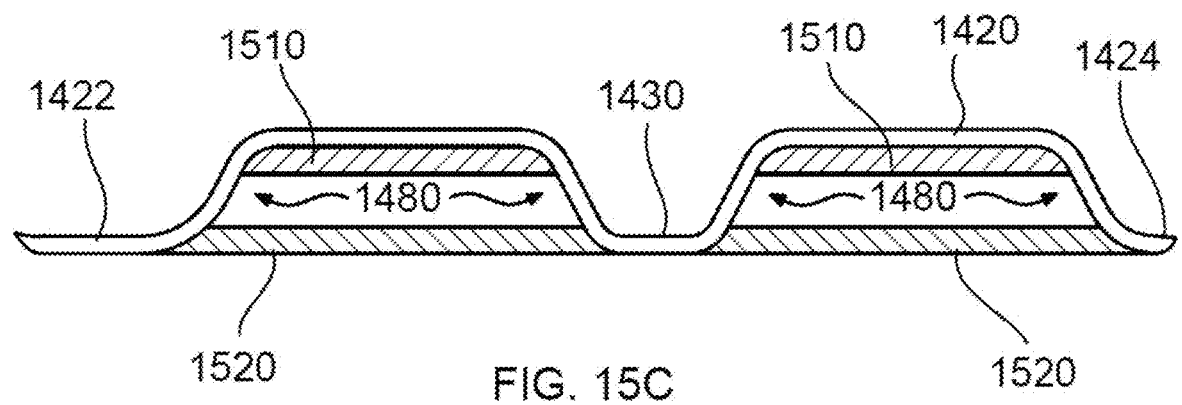
FIG. 15C is an end view of a solar shingle with two phase change material layers.

FIG. 15C is an end view of a solar shingle with two phase change material layers. Two air gaps channels 1480 are shown below the bottom surface of the solar shingle 1420. A first layer of phase change material 1510 is shown on the bottom of the solar shingle 1420 and above the air gap channel 1480. A second layer of phase change material (PCM) 1520 is shown below the air gap channel 1480. Inserting edge 1424 and receiving edge 1422 are shown. Channel 1430 is shown between the two air gaps channels 1480. The first layer PCM 1510 is configured to change during wintertime temperatures of 5 degrees Celsius and lower. The bottom surface of solar shingle 1420 in contact with the first layer PCM 1510 may further have a heat reflective material or coating that directs heat away from the bottom surface and towards the air gap channel. This heat reflective material may be included in all embodiments with or without phase change materials. In every case where this heat reflective material is used, the heat is directed away from the bottom surface of the solar shingle 1420 which increases the energy production efficiency of the solar shingle. The second layer PCM 1520 is tuned to operate during summertime of 20 degrees Celsius and above. The second layer PCM 1520 further enhances the ability of the roofing assembly to keep the solar shingle 1420 cooler by absorbing heat during the day, then expelling the excess heat at night. Every day the PCM cycles from one state to another (typically from a solid to a liquid state). The second layer PCM 1520 is tuned to operate during summertime of 20 degrees Celsius and above.

Figure 15D:
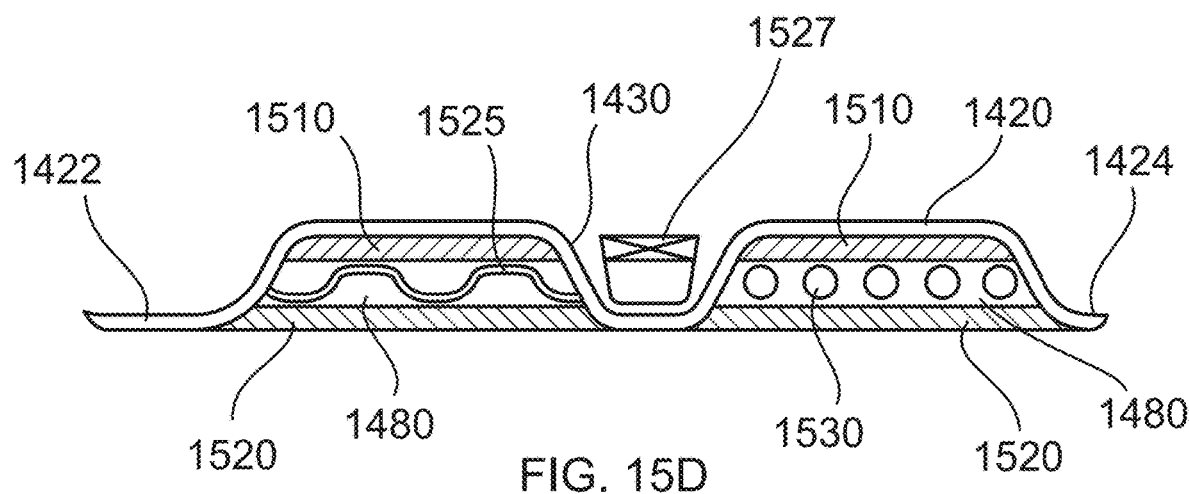
FIG. 15D is an end view of a solar shingle with two phase change material layers and support structure in the air gap area.

FIG. 15D is an end view of a solar shingle with two phase change material layers and support structure in the air gap area. Two air gaps channels 1480 are shown below the bottom surface of the solar shingle 1420. A first layer of phase change material 1510 is shown on the bottom of the solar shingle 1420 and above the air gap channel 1480. A second layer of phase change material (PCM) 1520 is shown below the air gap channel 1480. Inserting edge 1424 and receiving edge 1422 are shown. Channel 1430 is shown between the two air gaps channels 1480. Support structure 1527 is shown in channel 1430. In this embodiment, workers may stand on the support structure 1527 when doing maintenance on the solar shingles. This provides a place to stand on the roof so that the worker does not have to walk on the shingles. There are also reinforcing members shown inside the air gap channel 1480. Corrugated structure 1525 and pipes 1530 are examples of two methods to provide additional structural support that enhances the snow loading strength of the solar shingle 1420.

Figure 15E:
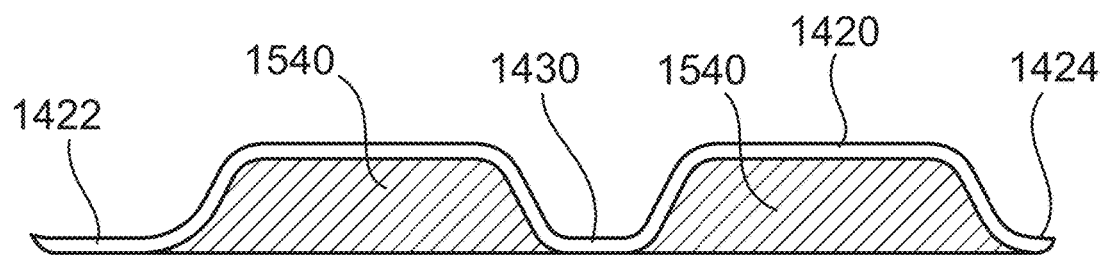
FIG. 15E is an end view of a solar shingle with a phase change material layer.

FIG. 15E is an end view of a solar shingle with a phase change material layer. In this embodiment, the solar shingle 1420 further comprises a phase change material 1540 below the bottom surface of the solar shingle extending to the roof or membrane surface. Inserting edge 1424 and receiving edge 1422 are shown. Channel 1430 is shown between the two air gaps channels 1480.

Figure 15F:
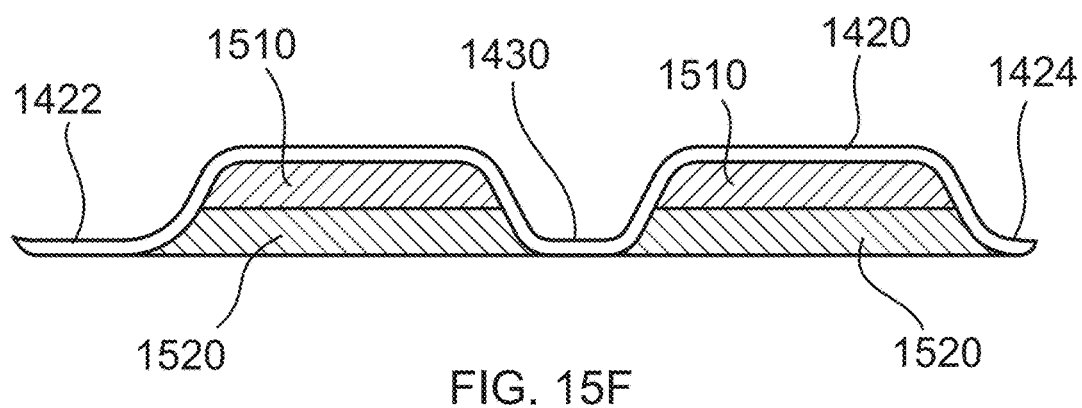
FIG. 15F is an end view of a solar shingle with two phase change material layers.

FIG. 15F is an end view of a solar shingle with two phase change material layers. The solar shingle 1420 as shown further comprises a first layer phase change material 1510 below the bottom surface of the solar shingle along with a second layer PCM 1520 extending to the roof or membrane surface. Inserting edge 1424 and receiving edge 1422 are shown. Channel 1430 is shown between the two air gaps channels 1480.

FIG. 16A is a section view of a solar shingle with two phase change layers and air gap. This embodiment illustrates heat energy 1604 from the sun 1602 heating the solar shingle 1420 and warming a first layer winter PCM 1610 during wintertime temperatures. During the day when the sun is out, this heat transfer continues on through the air gap 1480 and heats a second layer summer PCM 1622. At nighttime and during overcast or cold times of the day, heat energy stored in the second layer summer PCM 1622 is transferred 1614 via the air gap channel 1480 and on to the first layer winter PCM 1610. This heat transfer 1614 enhances the performance of the first layer winter PCM 1610 in retaining heat from the daytime sun warming of PCM 1610.

FIG. 15G is an isometric view of a solar shingle with air flow passing through. Solar shingle 1420 is shown. Channel 1430, inserting edge 1424 and receiving edge 1422 are shown. Openings 1550, 1552 and 1554. Each of these openings have control features that adjust the amount of air flowing through the air gap area. The various openings may have separate control features. For example, opening 1550 may have a passive plate or passive door that closes off the opening 1550 when temperatures are cool or cold. As the temperature increases during the day when the sun is out, the size of the opening 1550 may be automatically and passively increased based on higher temperatures. The maximum opening size may be achieved during the hottest temperatures in the summertime, thus creating as much air flow as possible in order to keep the back side of the solar shingles 1420 cool.

Opening 1552 may have an active control system that comprises a motorized louver that is activated by a control system. The control system may determine the position of the louver based on the required air flow for a specific situation. Temperature sensors on the outside of the shingle may determine that it is cold outside, and the shingle needs to collect and store heat during the day to stay warm at night. In this example, the control system may reduce the air flow to a minimal amount in order to retain as much heat as needed for storage in the PCM. In some cases, the louver may be closed off completely so that as much heat as possible may be collected during the day when the sun is out.

Opening 1554 may be controlled by temperature sensors outside of the shingle and inside the air gap below the bottom surface of the solar shingle 1420. The sensors may inform a control system how to adjust the opening size based on the desired air flow and how much heat is to be retained within the air gap area.

Cool Air 1412 is drawn in at the base of solar shingle 1420 thru openings 1550, 1552 and 1554 as shown. Warm air 1416 draws air up from the bottom of the solar shingle 1420 and pulls it our through additional openings 1560, 1562 and 1564 at the top of the solar shingle 1420. The solar shingle may only have control at either the top or bottom of the shingle. In some embodiments, shingles with air flow control may only be placed on a bottom row of shingles or on a top row of shingles. In this case, the entire air flow is controlled by the one row of shingles since the naturally convection of the heated air carries it across the multiple rows of shingles. For example, once the air enters one of the lower openings 1550 1552 or 1554, the air then naturally flows up through the air gap areas of all rows of shingles as the air makes its way towards the top of the shingles where it is vented out as heated air 1416 into the atmosphere.

In other embodiments, the air control may be embedded in the membrane at the bottom of the roof assembly (near the rain gutter). The air control may also be incorporated into the ridge vent that extends across the entire top of the top row of shingles. The top vent with air flow control may be partially embedded in the membrane.

FIG. 15H is an end view of a solar shingle with air flow openings. Solar Shingle 1420 is shown with channel 1430, inserting edge 1424 and receiving edge 1422. Passively controlled opening 1550 is shown along with actively controlled opening 1552. Motor 1574 operates to open and close a louver to adjust and restrict the air flow based on commands from the control system.

Figure 15I:
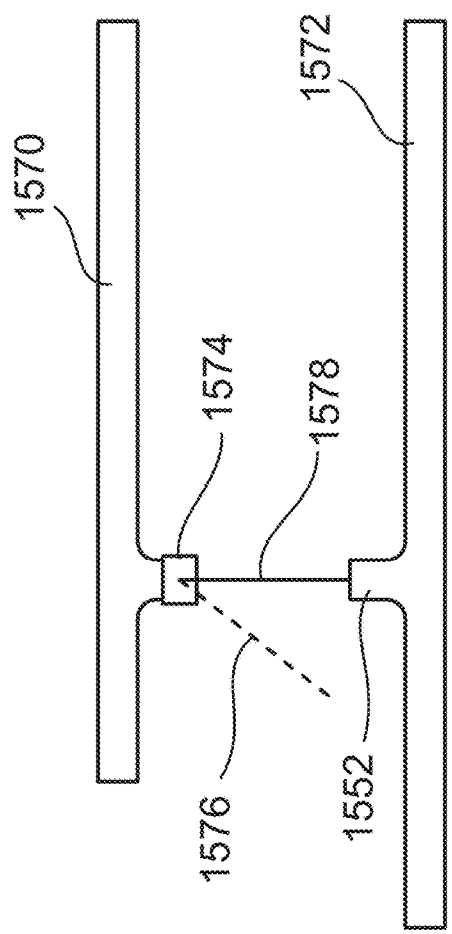
FIG. 15I is a side view of a solar shingle air flow opening with louver.

FIG. 15I is a side view of a solar shingle air flow opening with louver. Top plate 1570 and bottom plate 1572 of a solar shingle are shown in this section. Motor 1574 operates to adjust the position of louver 1578. In this example the louver 1578 is shown in a closed position. When air flow is needed, the control system activates the motor 1574 to move louver 1578 into an open position 1576 allowing air to flow through the opening 1552.

Figure 15J:
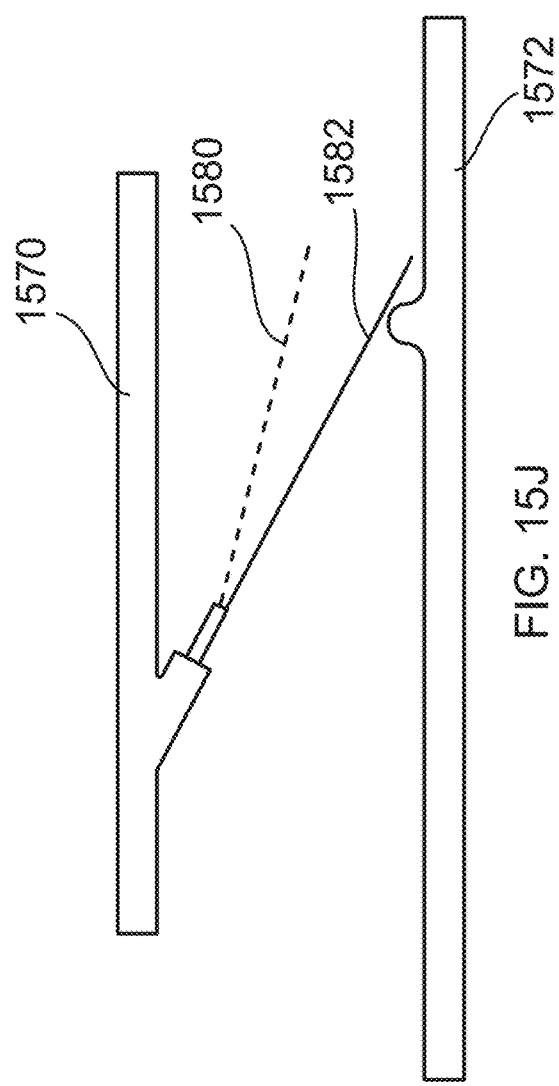
FIG. 15J is a side view of a solar shingle air flow opening with passive plate.

FIG. 15J is a side view of a solar shingle air flow opening with passive plate. In this example, top plate 1570 and bottom plate 1572 of a solar shingle are shown with a passive structure that automatically controls the air flow without a control system. The door 1582 is shown in a closed (normal) condition when the temperature is within a lower range. As the door 1582 is heated it gradually opens to a partially open position 1580 as shown. The natural expansion and contraction of materials based on temperature may be incorporated into the door 1582 itself or in other supporting structures causing this action (making the opening wider based on increased temperatures) to take place. This passive control mechanism may not need any input or monitoring from a control system in certain embodiments. In other embodiments, however, it may be tied in to a control system via sensors or other monitoring devices.

FIG. 16B is a section view of another embodiment of a solar shingle with two phase change layers and air gap. This embodiment illustrates how the solar shingle 1420 expels heat during the summertime. A first layer PCM 1612 is largely passive during the summertime operation. Heat transfer 1654 allows heat to be transferred thru PCM 1612 and on to enter second layer PCM 1620 via entry transfer 1656 during daytime hours. At night, or when the exterior temperature is cooler, PCM 1620 then transfers heat 1654 from the second layer PCM 1620 through the air gap channel 1480 and through PCM 1612 and exit transfer 1652 out through the top surface of solar shingle 1420 into the cooler nighttime air. This nighttime heat transfer 1662 draws the heat out of the roofing assembly into the cooler nighttime air above the roof.

Figure 17:
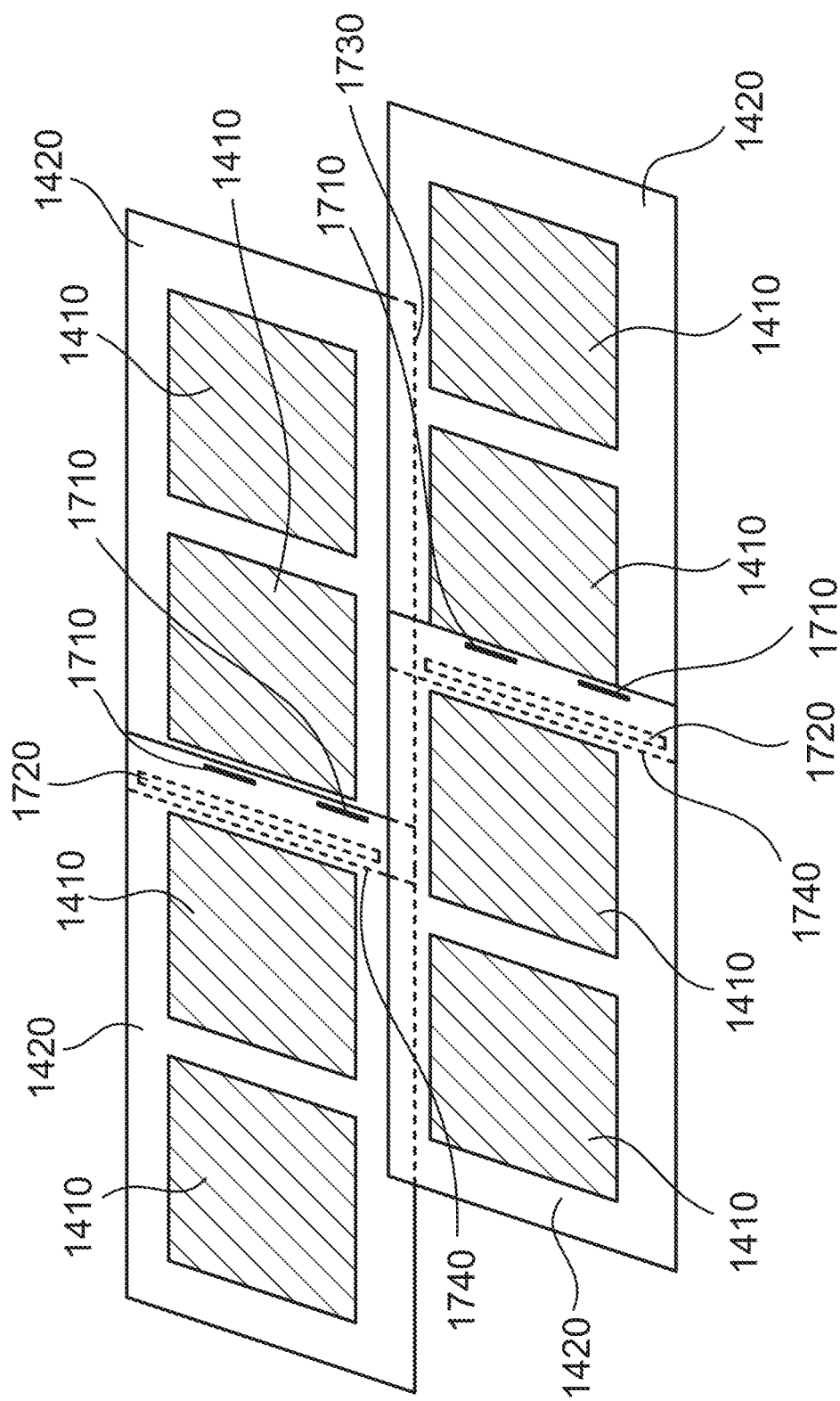
FIG. 17 is an illustration of several solar shingles installed on a roof.

FIG. 17 is an illustration of several solar shingles installed on a roof. Overlapping sides 1740 of solar shingles 1420 are mechanically interlocked 1710. Each row of solar shingles 1420 further overlap 1730 adjacent rows of shingles. In certain embodiments, the solar shingles 1420 further comprise a waterproof sealant 1720 that seals against water and air penetration between the solar shingles 1420. PV modules 1410 are shown embedded in the top surface of the solar shingles 1420 and are not blocked by the overlapping sides 1740.

Figure 18A:
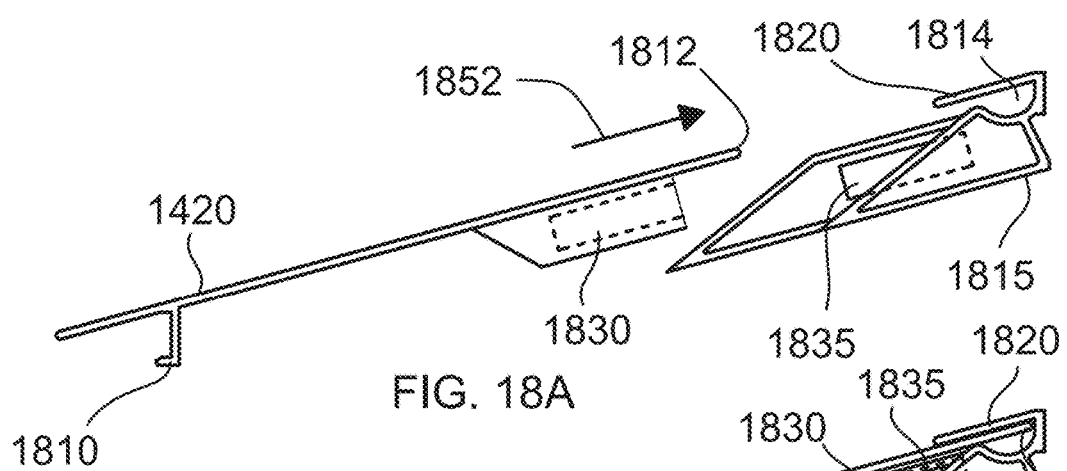
FIG. 18A is a side view of a solar shingle being inserted into a shingle support bracket.

FIG. 18A is a side view of a solar shingle being inserted into a shingle support bracket. Solar shingle 1420 is shown being inserted 1852 into bracket 1815 with the edge 1812 of solar shingle 1420 entering the channel 1814 of bracket 1815 below retaining member 1820. Electrical connectors 1830 and 1835 are shown prior to being connected to each other. Retaining member 1810 is shown that is configured to mechanically connect to a lower bracket (not shown).

Figure 18B:
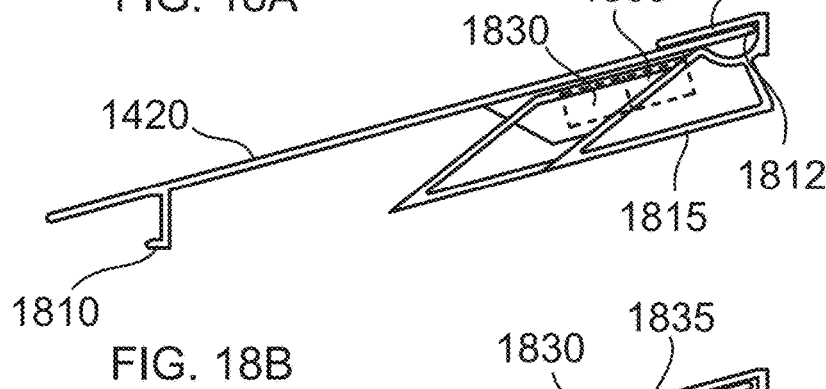
FIG. 18B is a side view of a solar shingle fully seated and connected to the support bracket.

FIG. 18B is a side view of a solar shingle fully seated and connected to the support bracket. Solar shingle 1420 is shown fully seated and connected (both mechanically and electrically) to bracket 1815. Edge 1812 is inside the channel below retaining member 1820. Electrical connectors 1830 and 1835 are shown fully seated and connected together.

Figure 18C:
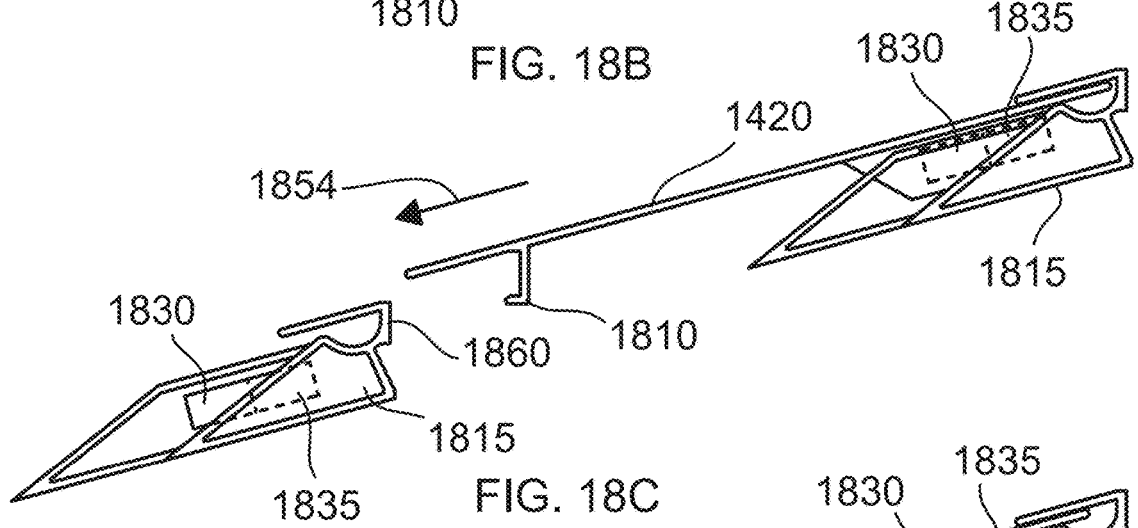
FIG. 18C is a side view of a solar shingle sliding down towards a second support bracket after having been fully engaged and connected to a first upper bracket.

FIG. 18C is a side view of a solar shingle sliding down towards a second support bracket after having been fully engaged and connected to a first upper bracket. In this example embodiment, solar shingle 1420 is sliding 1854 downwards towards a second or lower bracket 1815 as shown. Electrical connectors 1830 and 1835 are retained in a fully connected state as the shingle is slid 1854 downwards towards the lower bracket 1815. Retaining member 1810 is being aligned with the receiving edge 1860 of bracket 1815 as shown.

Figure 18D:
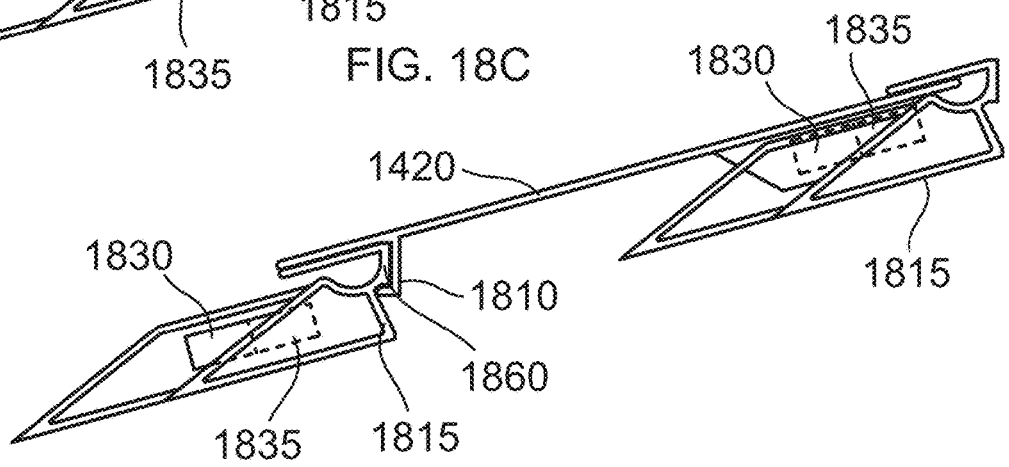
FIG. 18D is a side view of a solar shingle connected to a first upper bracket above and fully engaged with a second support bracket below.

FIG. 18D is a side view of a solar shingle connected to a first upper bracket above and fully engaged with a second support bracket below. Solar shingle 1420 is shown fully engaged with both the upper bracket 1815 and lower bracket 1815. Electrical connectors 1830 and 1835 are retained in a fully connected states. Retaining member 1810 is now fully mechanically engaged with the receiving edge 1860 of bracket 1815 as shown.

Figure 19A:
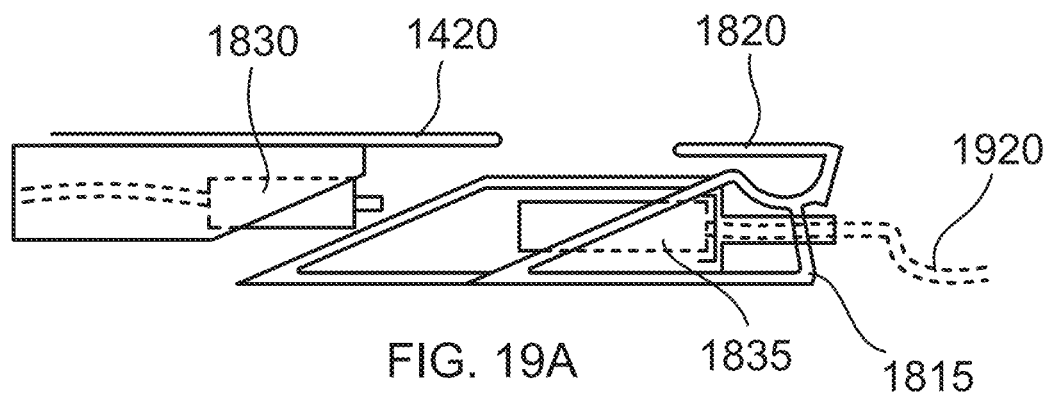
FIG. 19A is a side view of a solar shingle connector before being plugged into a bracket receiving connector.

FIG. 19A is a side view of a solar shingle connector before being plugged into a bracket receiving connector. This view illustrates how a solar shingle 1420 aligns with bracket 1815 prior to insertion of the solar shingle 1420 into the bracket 1815. Male MC4 connector 1830 is shown aligning to female MC4 connector 1835. Electrical wire 1920 is shown with slack in it, allowing for the wire 1920 to be extended when required.

Figure 19B:
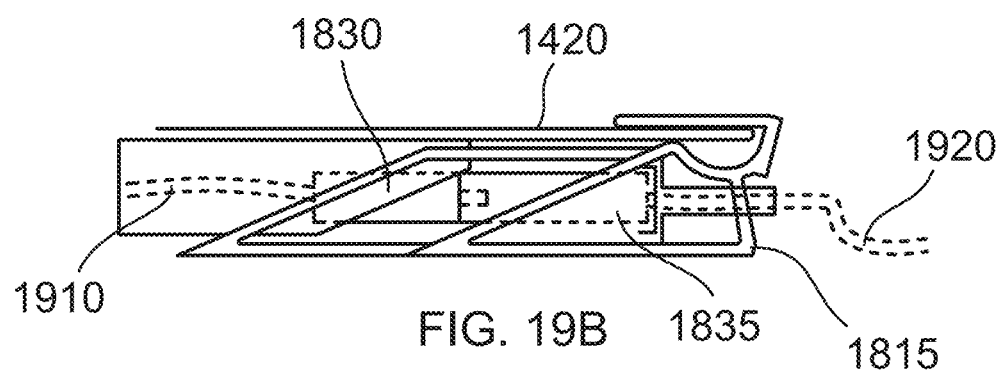
FIG. 19B is a side view of a solar shingle connector fully seated and connected to a bracket receiving connector.

FIG. 19B is a side view of a solar shingle connector fully seated and connected to a bracket receiving connector. Solar shingle 1420 is now fully seated and engaged mechanically and electrically with bracket 1815. Connector 1830 is fully connected to connector 1835. Electrical wire 1910 extends to the solar PV components of solar shingle 1420. Wire 1920 still has slack in it.

Figure 19C:
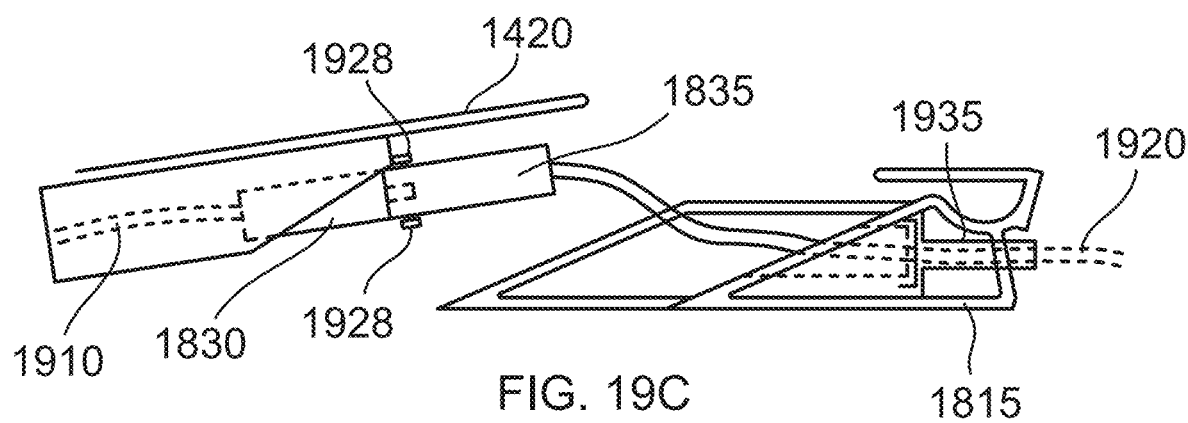
FIG. 19C is a side view of a solar shingle being removed from a bracket receiving connector with the electrical MC4 connectors still connected.

FIG. 19C is a side view of a solar shingle being removed from a bracket receiving connector with the electrical MC4 connectors still connected. This example illustrates solar shingle 1420 being removed from the bracket 1815. As the solar shingle 1420 is removed from bracket 1815, the electrical MC4 connectors 1830 and 1835 remain connected, being held together with release clips 1928. In order to disconnect the electrical connectors 1830 and 1835, the retaining clips 1928 must be released. The slack in wire 1920 allows the solar shingle 1420 to be mechanically disconnected from bracket 1815 prior to releasing the clips 1928. This is achieved by a wire channel 1935 which allows wire 1920 to be drawn thru the channel 1935 allowing access to the releasing clips 1928. Once the release clips have been released, the solar shingle 1420 may be fully removed (and replaced if needed) from the system.

Figure 19D:
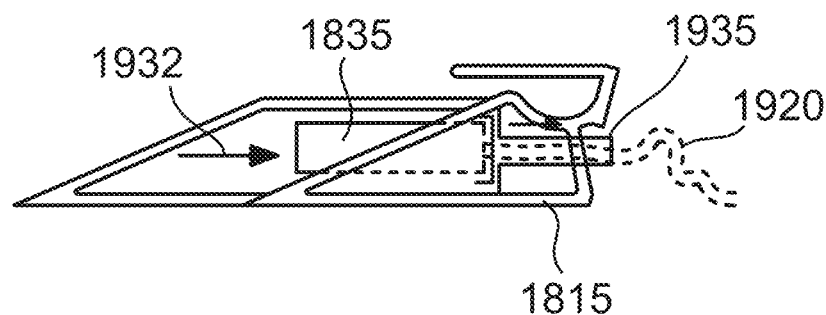
FIG. 19D is a side view of a bracket receiving connector with the MC4 connector returned to an original position.

FIG. 19D is a side view of a bracket receiving connector with the MC4 connector returned to an original position. In this example, the bracket 1815 is shown with the female MC4 connector 1835 pushed 1932 back into place inside of bracket 1815 and ready to receive a new solar shingle 1420. Channel 1935 provides an unobstructed pathway for wire 1920 to be pushed back behind the bracket 1920 with slack in it as it was in its original position.

Figure 20A:
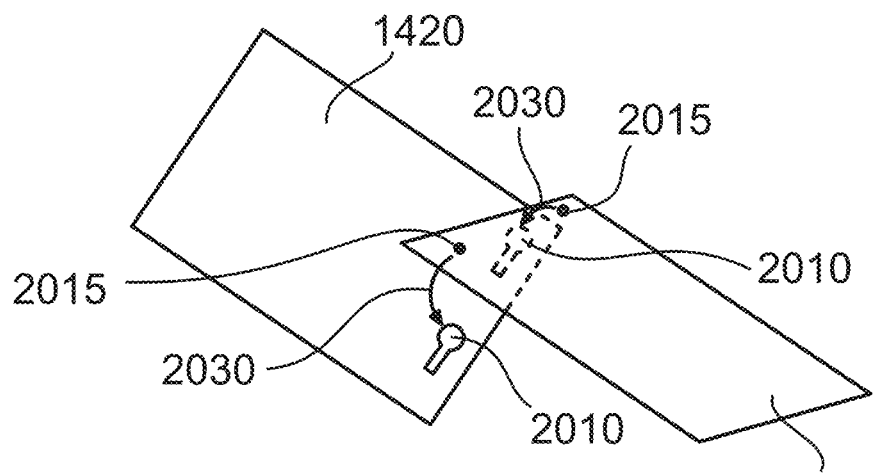
FIG. 20A is an illustration of two shingles on a roof with a first shingle being installed on to a second shingle.

FIG. 20A is an illustration of two shingles on a roof with a first shingle being installed on to a second shingle. A solar shingle 1420 is shown installed on a roof with a second solar shingle 2020 being placed above solar shingle 1420 and ready to be connected. Pins 2015 align 2030 with slots 2010 prior to connecting the two shingles together.

Figure 20B:
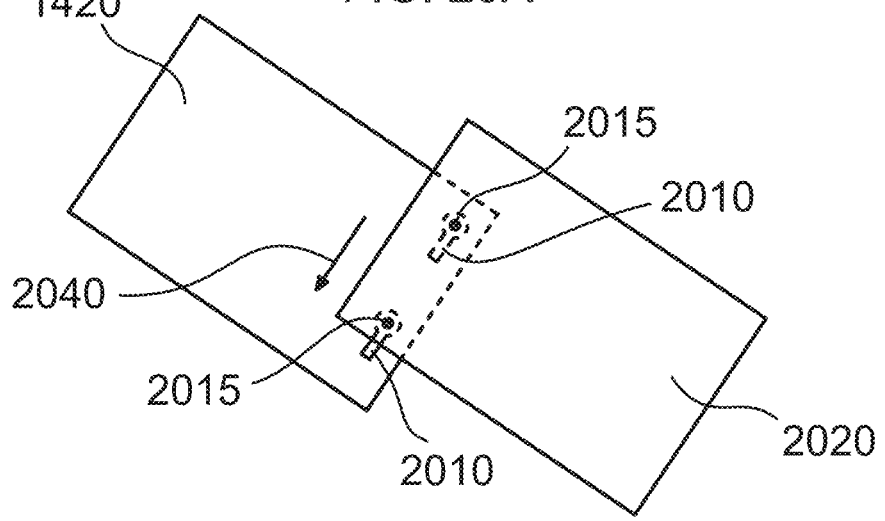
FIG. 20B is an illustration of two shingles on a roof with a first shingle on top of a second shingle and sliding into place onto the second shingle.

FIG. 20B is an illustration of two shingles on a roof with a first shingle on top of a second shingle and sliding into place onto the second shingle. Shingle 2020 has now been placed directly on top of solar shingle 1420 in this illustration with the pins fully inserted in the top keyhole position of slots 2010. Once the shingles are in this position, shingle 2020 may be slid 2040 towards the bottom edge of solar shingle 1420 in order to cause the two shingles to become mechanically connected together.

Figure 20C:
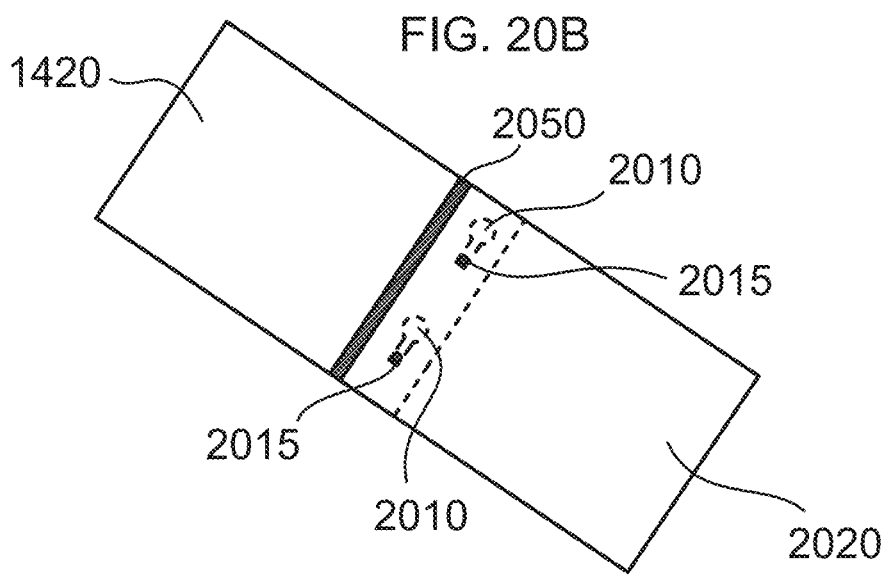
FIG. 20C is an illustration of two shingles connected together on a roof.

FIG. 20C is an illustration of two shingles connected together on a roof. The pins 2015 are now fully seated inside the slots 2015 mechanically connecting solar shingle 1420 and shingle 2020 together. Waterproof sealant 2050 is shown which seals the overlapping area between the shingles preventing water and air penetration between the solar shingles 1420 and shingle 2020.

Figure 21:
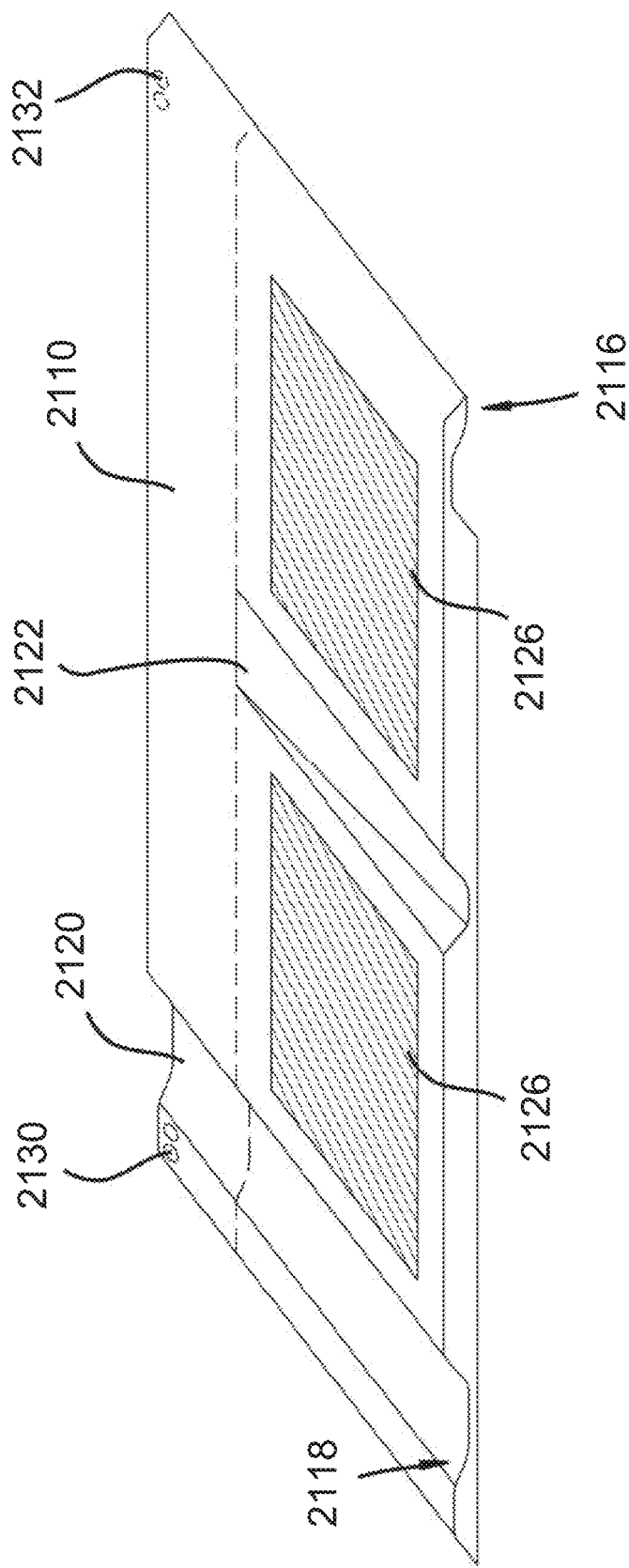
FIG. 21 is an isometric view of a solar shingle, according to one example embodiment.

FIG. 21 is an isometric view of a solar shingle, according to one example embodiment. Electrical contacts 2130 connect solar shingle 2110 to an adjacent solar shingle. Contacts 2132 connect the solar shingle to an adjacent solar shingle or to an electrical circuit embedded in a membrane. Channel 2120 provides a connection trough for the adhesive attachment of adjacent solar shingle, and provides a channel for water to be drawn down and away from the electrical contact area. Protruding edge 2116 interlocks with receiving edge of an adjacent solar shingle. In a similar fashion, receiving edge 2118 interlocks with a protruding edge of an adjacent solar shingle. Photovoltaic module surface area 2126 is also shown. Channel 2120 ramps down to the bottom edge of the solar shingle to allow water to be drawn down and away from the face of the shingle. This channel is superior to the standard configuration of 3 tab shingles because there is a base material providing a continuous structure between the tabs.

Figure 22A:
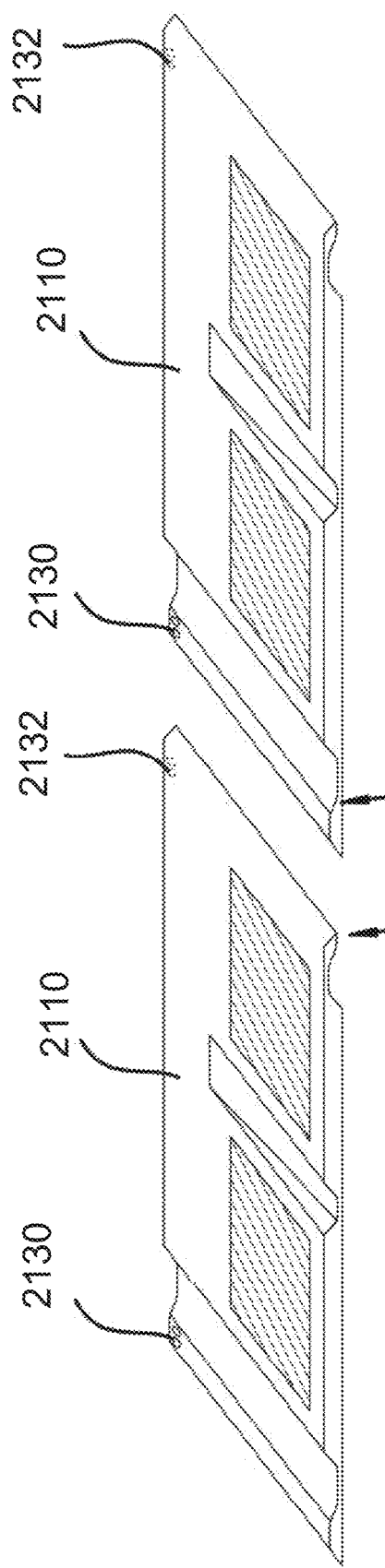
FIG. 22A is an isometric view of a two adjacent shingles not connected together, according to one embodiment.

FIG. 22A is an isometric view of a two adjacent shingles not connected together. Two adjacent shingles 2110 are shown before connection. Protruding edge 2116 is shaped to conform to adjacent receiving edge 2118. In another embodiment, shingles 2110 are solar shingles with contacts 2130 and 2132 for connection to adjacent solar shingles.

Figure 22B:
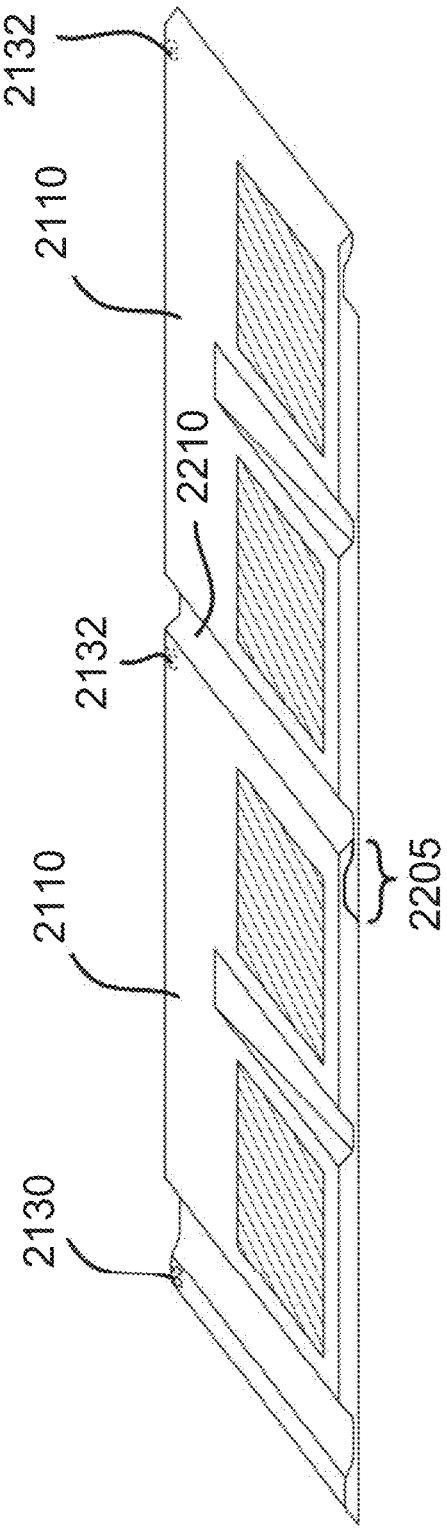
FIG. 22B is an isometric view of a two adjacent shingles connected together, according to one embodiment.

FIG. 22B is an isometric view of a two adjacent shingles 2110 connected together. Overlap area 2205 is shown where the two adjacent shingles 2110 are adhesively connected together, creating channel 2210. In another embodiment, shingles 2110 are solar shingles with contacts 2130 and 2132 for connection to adjacent solar shingles.

Figure 23:
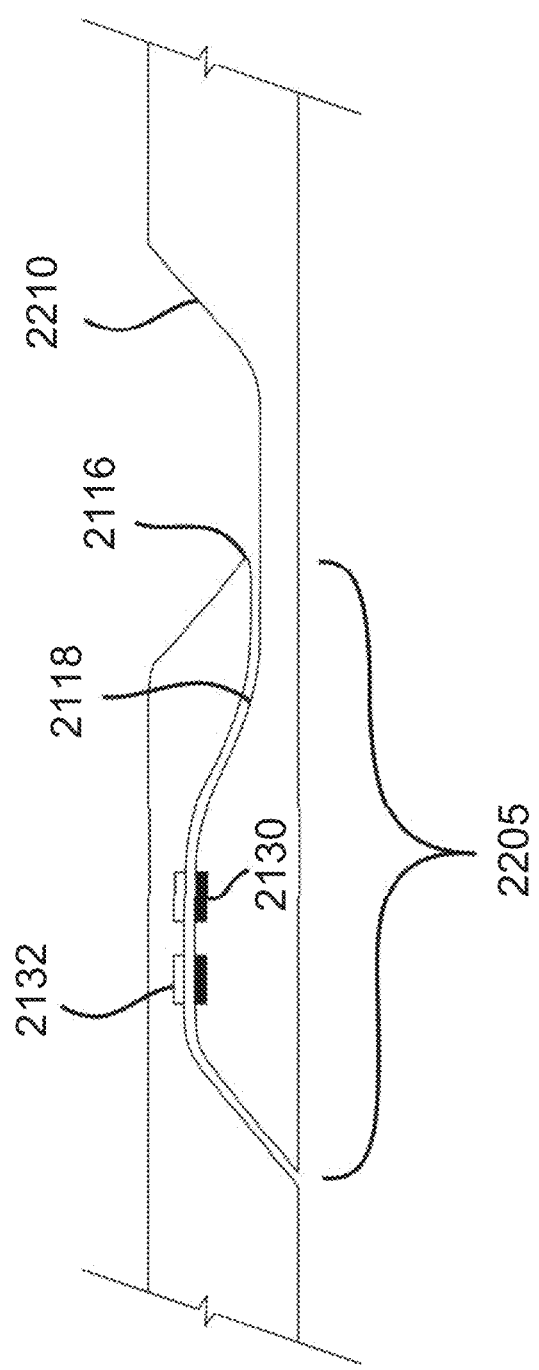
FIG. 23 is a cross section view showing the connection of two adjacent shingles, according to one embodiment.

FIG. 23 is a cross section view showing the connection of two adjacent shingles. Overlap area 2205 is shown where the two adjacent shingles are adhesively connected together. Protruding edge 2116 is shaped to conform to adjacent receiving edge 2118. Contacts 2132 electrically connect to contacts 2130 providing a pathway for current to flow from one solar shingle to another. Channel 2210 allows for water to be drawn down and away from the contact area. The convex shape of the channel interface with contacts 2130 embedded therein is at a higher elevation than the base of channel 2210, preventing water from penetrating up into the contact area. Additionally, the adhesive between the two solar shingle surfaces within overlap area 2205 further protects from water intrusion.

Figure 24:
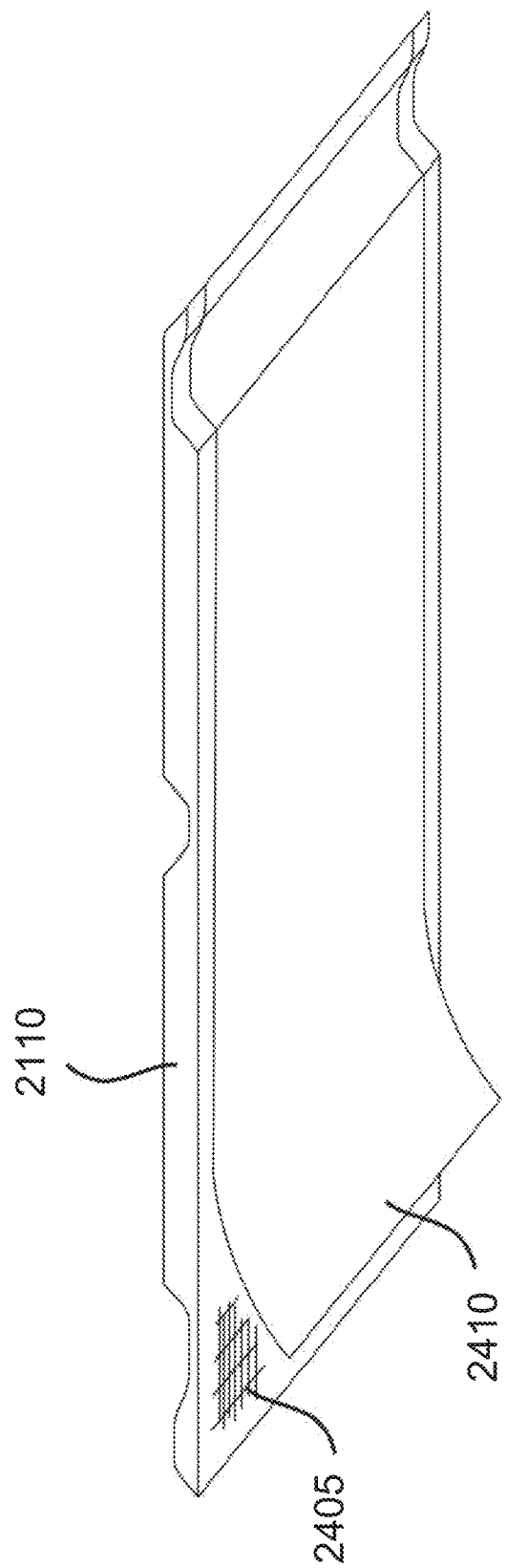
FIG. 24 is an isometric view of the roof facing bottom side of a shingle showing the adhesive and the protective backing material being removed, according to one embodiment.

FIG. 24 is an isometric view of the roof facing bottom side of a shingle 2110 showing the adhesive 2405, and the protective backing material 2410 being removed.

Figure 25:
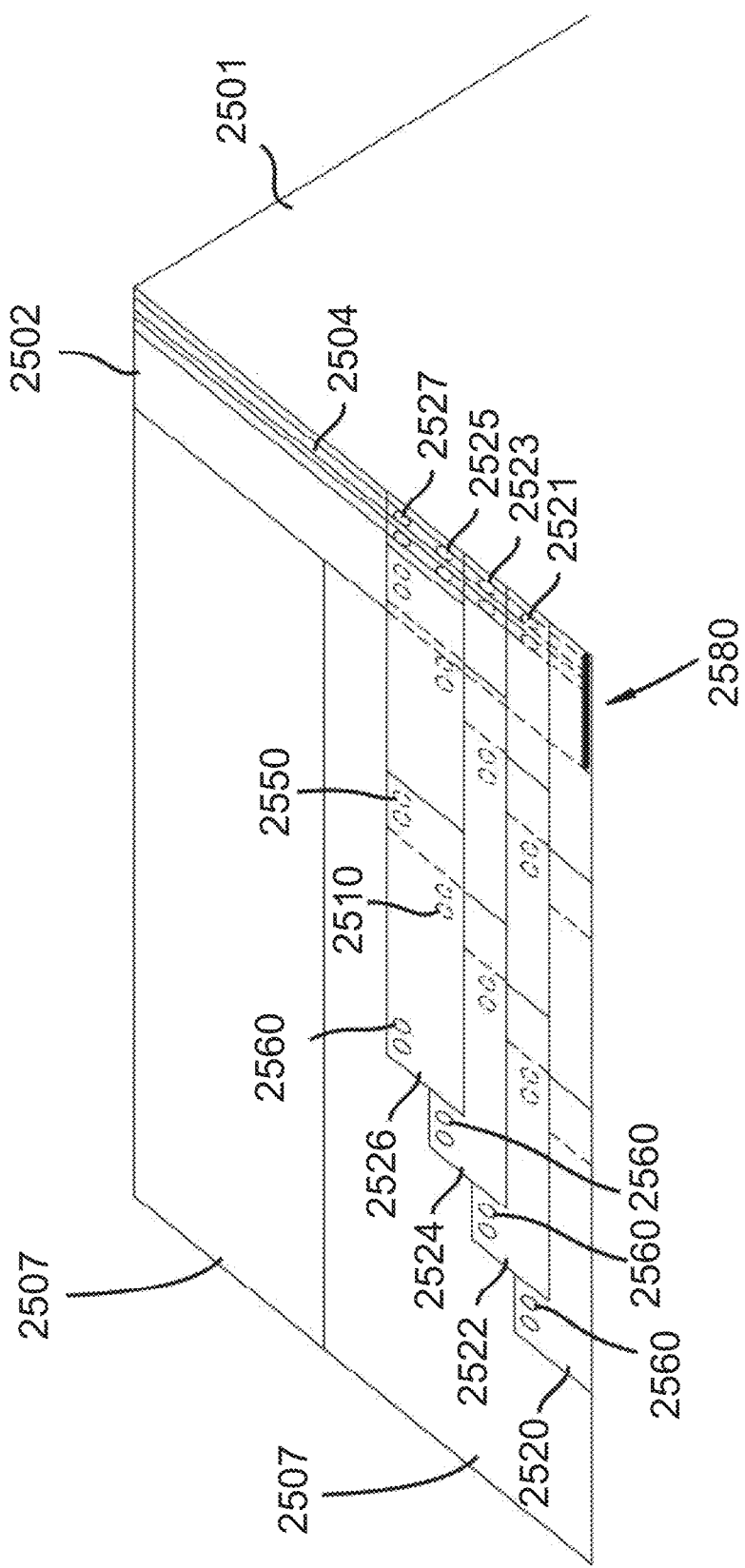
FIG. 25 is an isometric view of a roof showing the components of the electrical interconnection system, according to one embodiment.

FIG. 25 is an isometric view of a roof showing the components of the electrical interconnection system. The membrane 2502 is shown on one side of a roof 2501 and extends from the top of the roof down to the bottom of the roof. The membrane 2502 is cut to fit the length of the roof and is sealed 2580 with an electrically insulating and waterproof sealant. Rows of solar shingles 2520, 2522, 2524 and 2526 are shown installed on top of roofing underlayment 2507. Electrical contacts 2560 are shown that connect solar shingles to adjacent solar shingles. Electrical contacts 2510 and 2550 are on a bottom side of the solar shingles and are electrically and environmentally protected, both by the adhesive and also by the solar shingles overlapping the contact area. Contacts 2521, 2523, 2525 and 2527 are shown connecting shingle rows 2520, 2522, 2524 and 2526 to the membrane interface area 2504.

Figure 26:
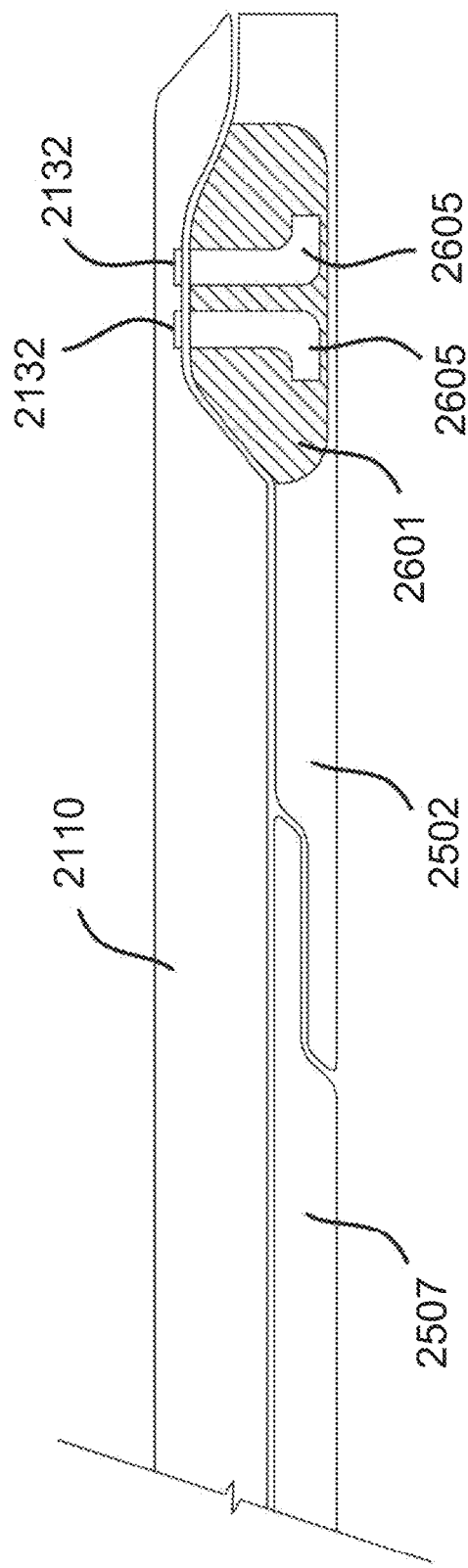
FIG. 26 is a section view of the electrical interconnection system showing the roof underlayment connecting to the membrane forming a seal, according to one embodiment.

FIG. 26 is a section view of the electrical interconnection system showing the roof underlayment 2507 connecting to the membrane 2502 forming a seal. Insulation 2601 is shown protecting electrical conductors 2605. The electrical conductors 2605 connect to contacts 2132 in the solar shingle 2110.

Figure 27:
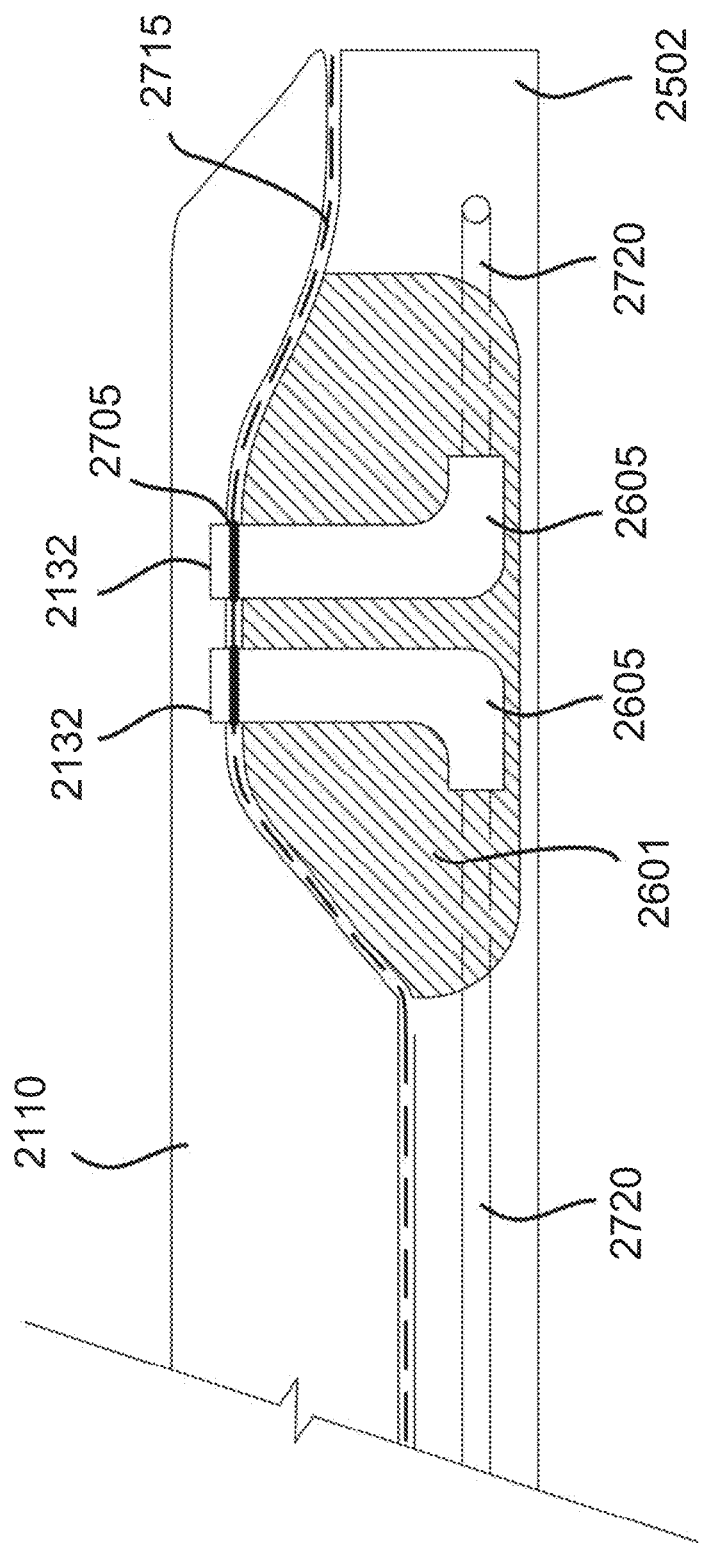
FIG. 27 is a large-scale section view of the interface between the membrane and solar shingle, according to one embodiment.

FIG. 27 is a large-scale section view of the interface between the membrane 2502 and electrical module 2110. Electrical wiring 720 is shown penetrating through the insulation 2601 and connecting to the electrical conductors 2605. Contacts 2132 inside the solar shingle 2110 are electrically connected by an electrically conductive material 2705 to a conductive surface of the electrical conductors 2605 as shown. Electrically insulating adhesive 2715 connects the solar shingle 2110 to the membrane 2502 and holds this connection in place providing an electrical pathway from the module to the electrical interconnection system.

Figure 28A:
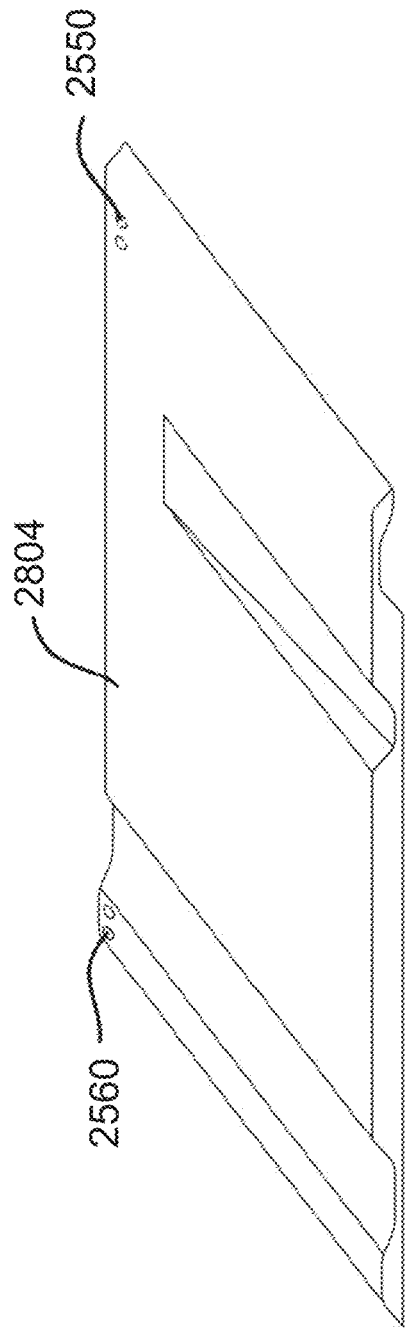
FIG. 28A is an isometric view of a short solar shingle showing the electrical contacts that interface with adjacent solar shingles, according to one embodiment.

FIG. 28A is an isometric view of a short solar shingle 2804 showing the electrical contacts 2560 that interface with adjacent solar shingles. The contacts 2550 connect to either the membrane or to an adjacent solar shingle.

Figure 28B:
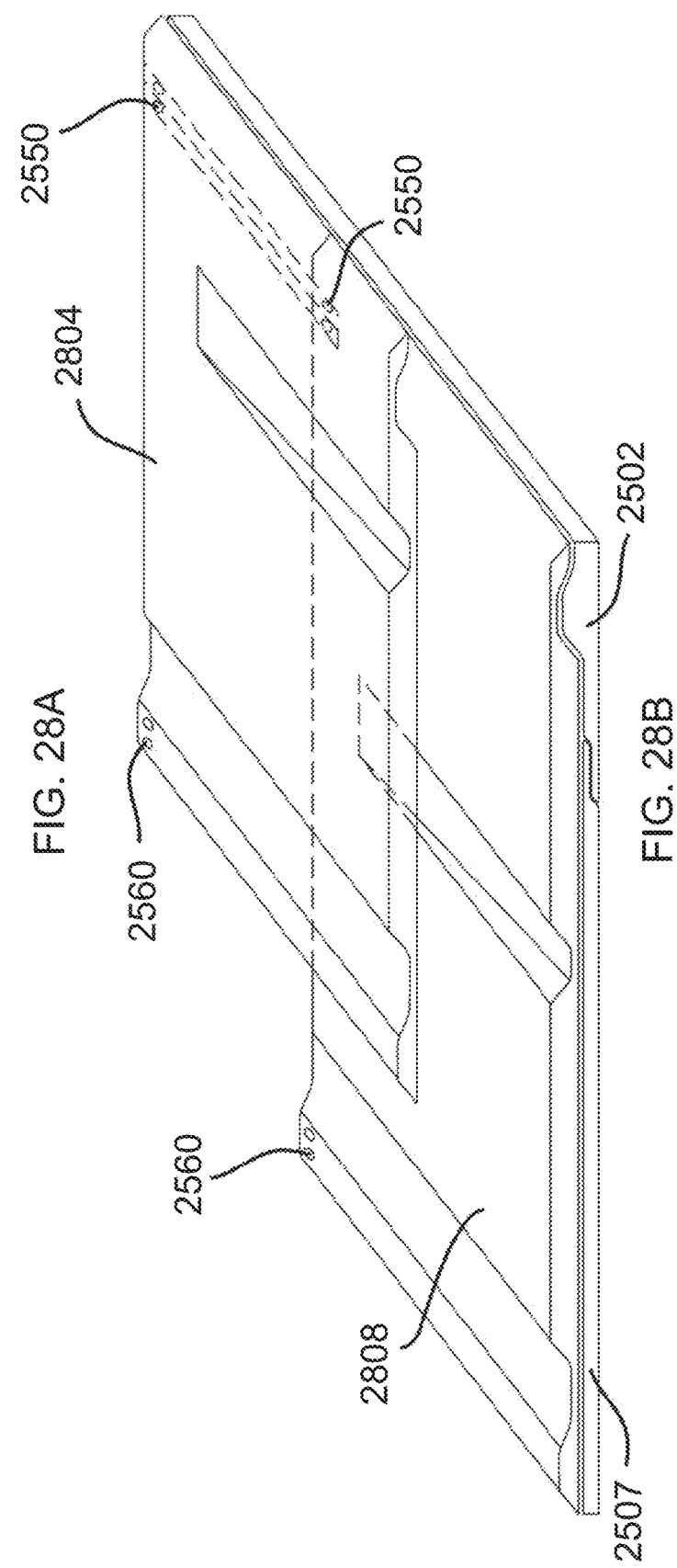
FIG. 28B is an isometric view of a short module stacked on top of and adhesively connected to a large module, according to one embodiment.

FIG. 28B is an isometric view of a short module 2804 stacked on top of and adhesively connected to a large module 2808. Contacts 2560 are shown which provide an electrical interface for adjacent solar shingles. The solar shingles are adhesively attached to the roof underlayment 2507 and membrane 2502. Solar shingle electrical contacts 2550 are connected to the membrane conductors as shown.

Figure 29:
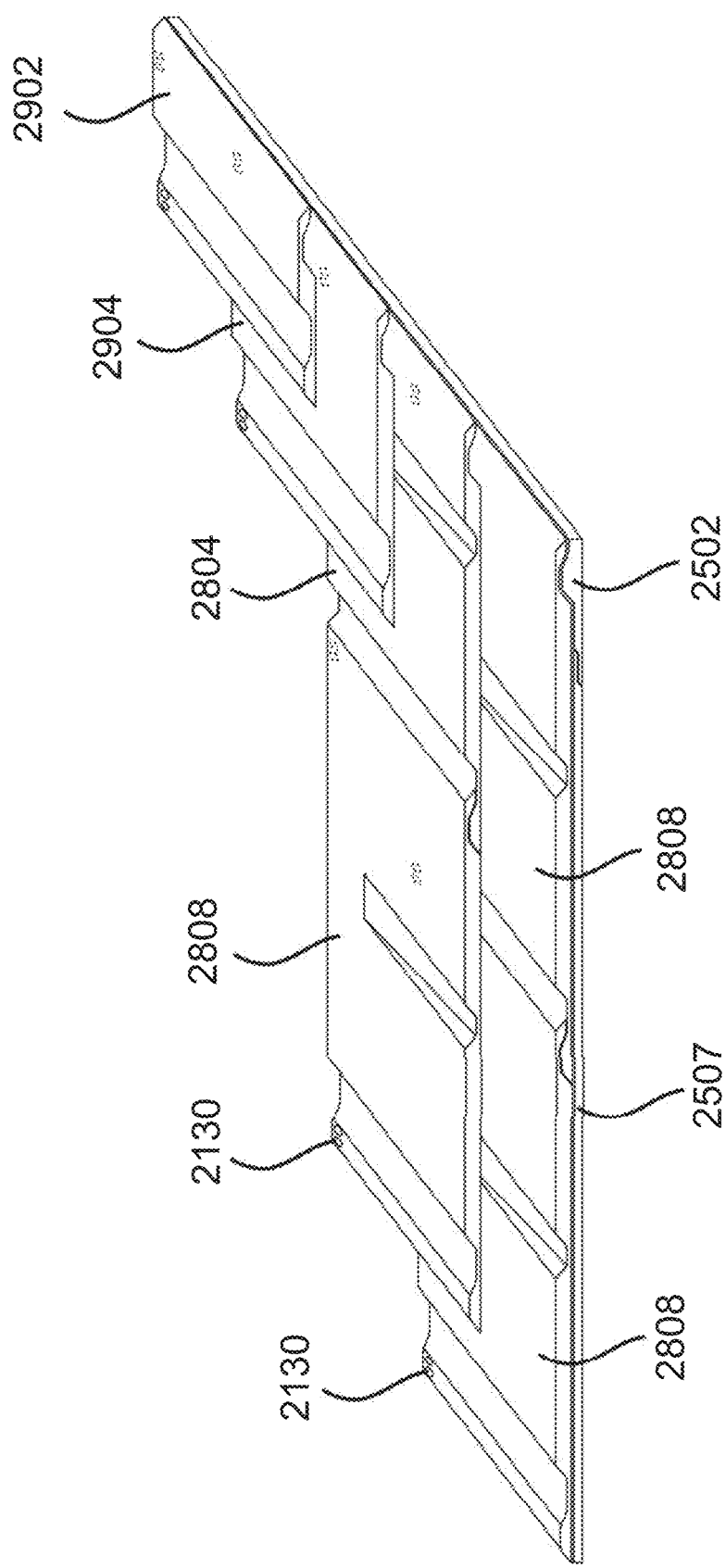
FIG. 29 is an isometric view showing a series of solar shingles of various sizes connected to the electrical interconnection system, according to one embodiment.

FIG. 29 is an isometric view showing a series of solar shingles of various sizes connected to the electrical interconnection system. Small solar shingle 2902 is stacked on top of medium solar shingle 2904 which is on top of a larger solar shingle 2804, which is then on top of a full-sized solar shingle 2808. Contacts 2130 are shown which provide an electrical interface for adjacent solar shingles. The solar shingles are adhesively attached to the membrane 2502 and roof underlayment 2507 as shown.

Figure 30:
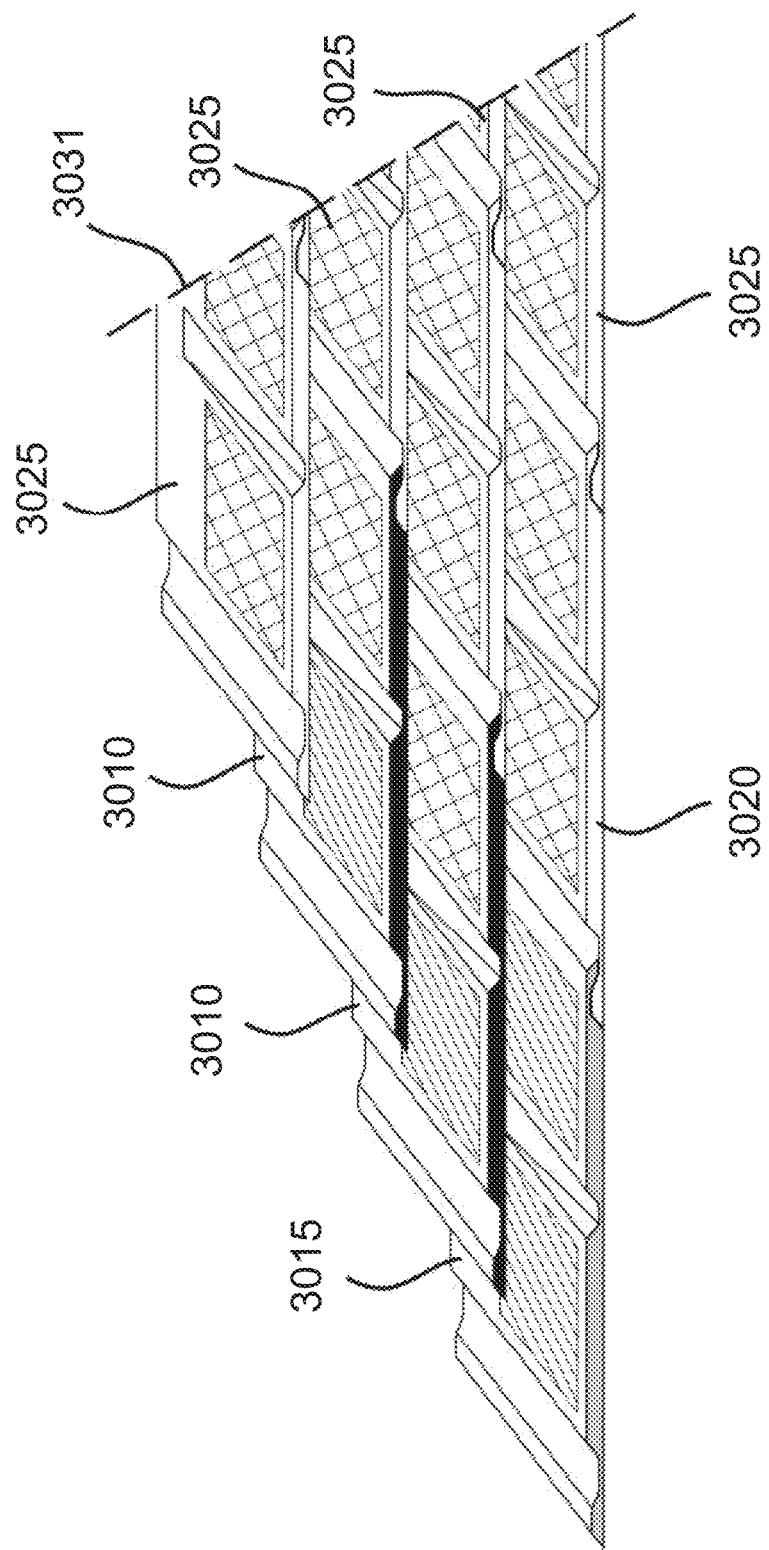
FIG. 30 is an isometric view of a series of shingles on a portion of a roof deck, according to one embodiment.

FIG. 30 is an isometric view of a series of shingles on a portion of a roof deck. Full size solar shingle 3015 is connected to congruent shingle 3020 on the base row which is then connected to partial congruent shingle 3025. Partial congruent shingle 3025 has been cut along line 3031 to accommodate roof valley or other roof obstruction. Combination shingles 3010 are also shown with a portion of the shingle being solar photovoltaic. Other congruent shingles 3025 are shown that have been cut to allow for the roof obstruction as shown.

Figure 31:
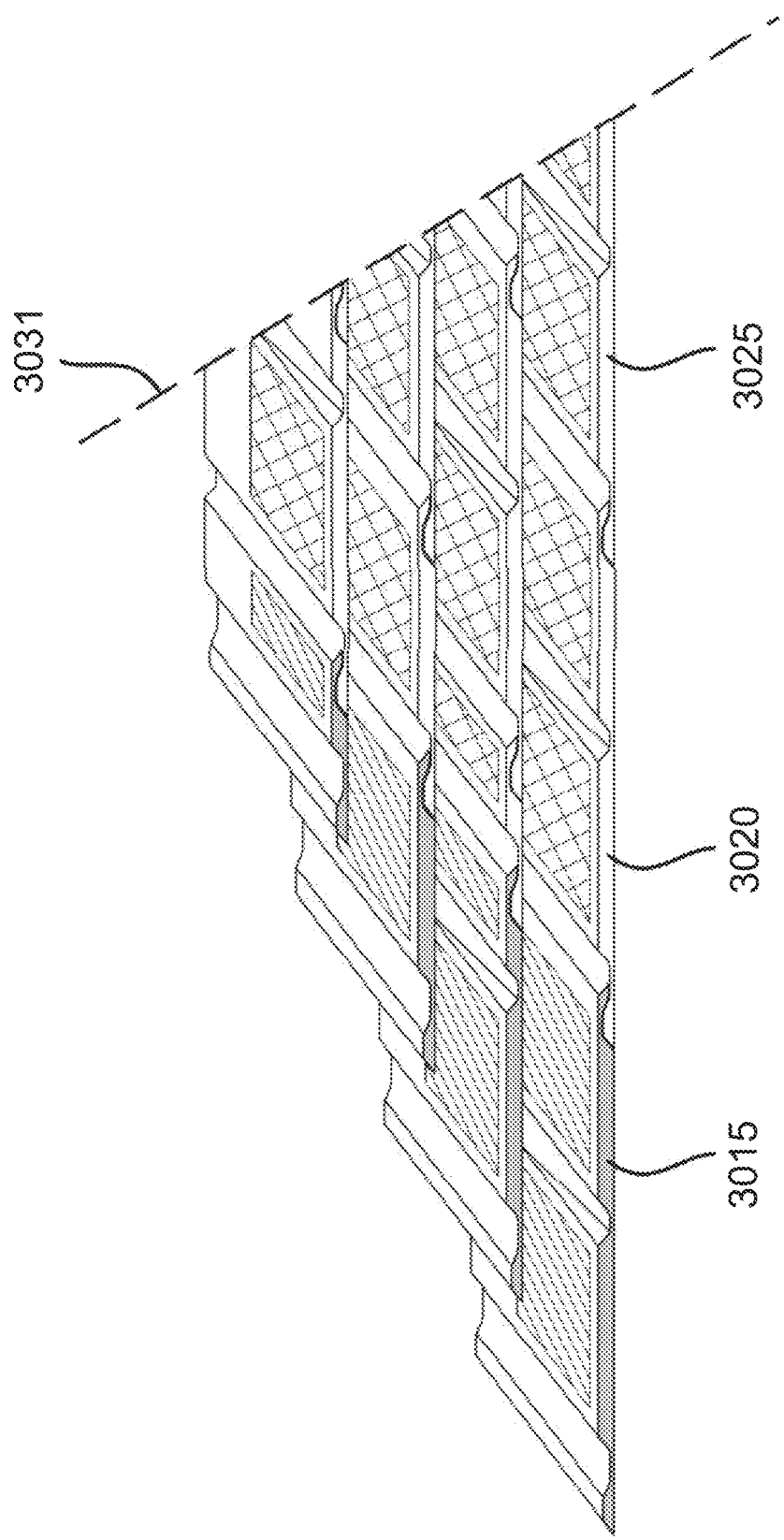
FIG. 31 is an isometric view of a series of shingles on a portion of a roof deck, according to another embodiment.

FIG. 31 is an isometric view of a series of shingles on a portion of a roof deck. Full-size solar shingle 3015 is connected to full-size congruent shingle 3020 on the base row which is then connected to partial congruent shingle 3025. Partial congruent shingles 3025 are cut along line 3031 to allow for the roof obstruction as shown.

Figure 32:
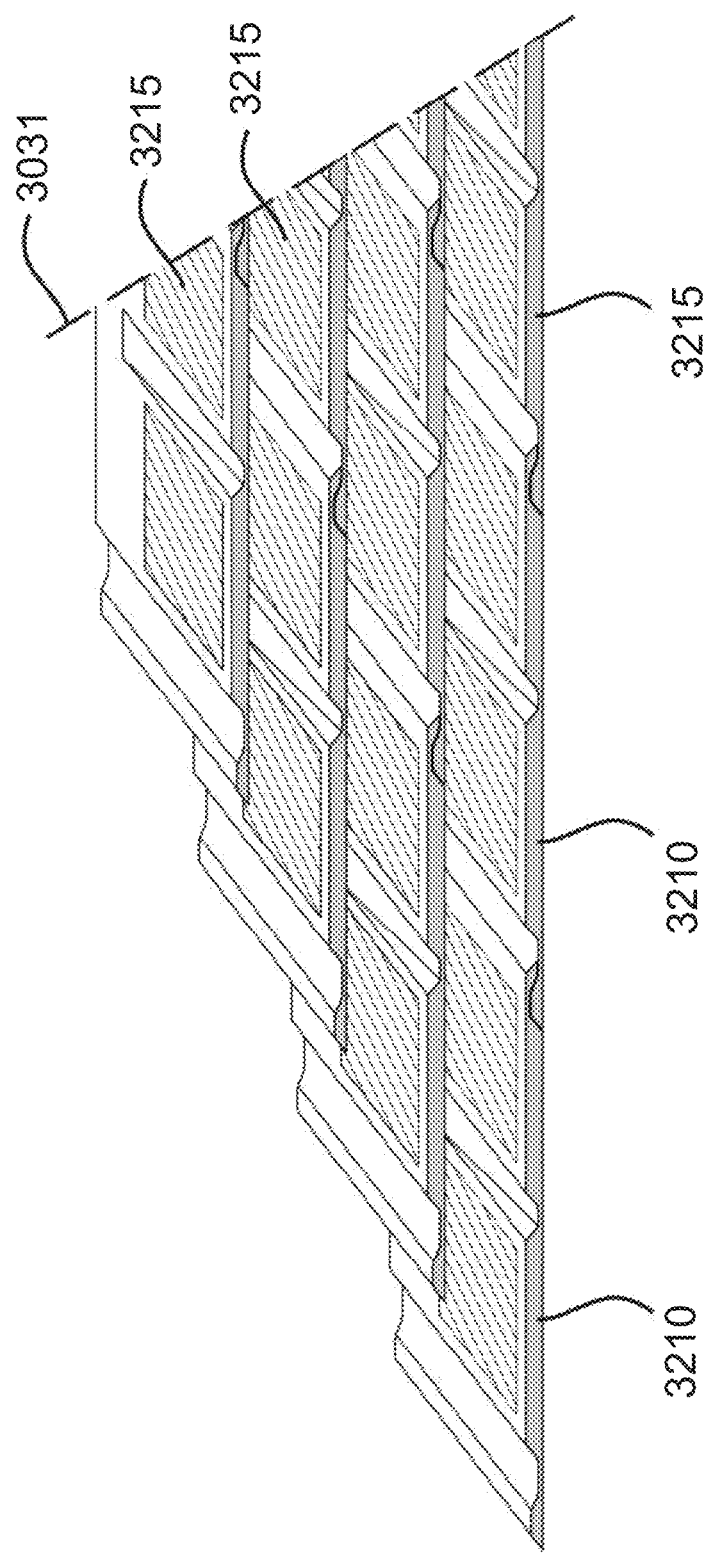
FIG. 32 is an isometric view of a series of shingles on a portion of a roof deck, according to one embodiment.

FIG. 32 is an isometric view of a series of shingles on a portion of a roof deck. Full size solar shingles 3210 are comprised of an amorphous silicon composition. Partial solar shingles 3215 along the cut line 3031 are still functional (producing a lower electrical current) after they have been cut to accommodate roof obstructions.

The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

All patents and published patent applications referred to herein are incorporated herein by reference. The invention has been described with reference to various specific and preferred embodiments and techniques. Nevertheless, it is understood that many variations and modifications may be made while remaining within the spirit and scope of the invention.

What is claimed is:

1. A solar shingle roofing assembly comprising:
   a roofing underlayment comprising mechanical connectors and electrical connectors for solar shingles;
   wherein the roofing underlayment further comprises a membrane;
   a structural attachment member having a mechanical first portion embedded within the membrane and having a mechanical second portion extending above the membrane, wherein the mechanical second portion of the mechanical attachment member is configured to mechanically attach a solar shingle to the roof;
   an electrical conductor having an electrical first portion of which is embedded within the membrane, having an electrical second portion which is configured to electrically connect to a solar shingle, and having an electrical third portion which is configured to electrically connect to an electrical circuit;
   an array of rectangular solar shingles, each solar shingle with a first side edge, a second side edge, a bottom edge and a top edge;
   each solar shingle shaped to form at least one channel on an upper surface running from the top edge to the bottom edge and shaped to form at least two air gap channels between the bottom surface of the shingle and the top surface of the underlayment and running parallel to the at least one channel;
   wherein, in the array of shingles, the air gap channels of vertically adjacent shingles are aligned to thereby form continuous air gaps channels running from a bottom of the array to a top of the array; and
   wherein the solar shingles mechanically attach to the mechanical second portion and electrically connect to the electrical second portion.

2. The invention of claim 1 wherein each solar shingle further comprises a first layer of phase change material on a bottom surface of each solar shingle.

3. The invention of claim 2 wherein each solar shingle further comprises a second layer of phase change material below the first layer of phase change material.

4. The invention of claim 2 wherein the first layer of phase change material is configured to change phase during wintertime temperatures of 5 degrees Celsius and lower; and wherein a second layer of phase change material is configured to change phase during summertime temperatures of 20 degrees Celsius and above.

5. The invention of claim 1 wherein a roof facing side of the membrane further comprises an adhesive covered by a protective backing material.

6. The invention of claim 1 wherein the solar shingles comprise a photovoltaic current producing module section embedded within a portion of the solar shingle.

7. The invention of claim 6 wherein the solar shingles further comprise a plurality of contacts wherein the contacts electrically connect the photovoltaic current producing module to electrical contacts in the membrane.

8. The invention of claim 7 wherein the solar shingles further comprise electrical wiring connecting the photovoltaic current producing module to the contacts.

9. The invention of claim 8 wherein the photovoltaic current producing module further comprises control circuiting which controls an electrical current flowing between one or more solar shingles.

10. The invention of claim 1 wherein a non-solar shingle, visually similar to the solar shingles, comprises a shingle of standard roofing material composition that has at least similar color and texture to the solar shingles.

11. The invention of claim 1 wherein the solar shingles further comprise a plurality of contacts wherein the contacts electrically connect the solar shingle to an adjacent solar shingle or combined shingle.

12. The invention of claim 1 wherein an overlap area comprising a waterproof sealant preventing air flow and water penetration between overlapping shingles seals all overlap areas between all overlapping sections of the overlapping shingles.

13. The invention of claim 12 wherein the overlap area further comprising mechanical interlocking features mechanically locking adjacent shingles together when installed.

14. The invention of claim 12 wherein the interlocking features comprising sliding channels that lock together the adjacent shingles and allowing the lock to be released when slid apart.

15. The invention of claim 1 wherein the electrical second portion of the electrical conductor is not embedded in the membrane and is routed within the air gap.

16. The invention of claim 1 wherein the multiple portions extending above the membrane are mechanically configured for receiving attachment members on multiple solar shingles; and wherein the attachment members on the multiple solar shingles further comprise electrical connection features.

17. The invention of claim 1 wherein each solar shingle further comprises an air flow control mechanism that controls the flow of air within the air gap channel.

18. The invention of claim 17 wherein the air flow control mechanism comprises a passive heat activated mechanism that increases the size of least one opening into the air gap channel when temperatures increase within the air gap channel.

19. The invention of claim 17 wherein the roofing underlayment further comprising control circuiting; and wherein the air flow control mechanism is activated by a signal received from the control circuiting.

* * * * *